US012803523B2

(12) United States Patent
Fukumitsu et al.

(10) Patent No.: US 12,803,523 B2
(45) Date of Patent: Nov. 17, 2026

(54) RESONANCE DEVICE AND METHOD FOR MANUFACTURING SAME

(71) Applicant: Murata Manufacturing Co., Ltd., Nagaokakyo (JP)

(72) Inventors: Masakazu Fukumitsu, Nagaokakyo (JP); Yoshiyuki Higuchi, Nagaokakyo (JP); Takehiko Kishi, Nagaokakyo (JP)

(73) Assignee: MURATA MANUFACTURING CO., LTD., Nagaokakyo (JP)

( * ) Notice: Subject to any disclaimer, the term of this patent is extended or adjusted under 35 U.S.C. 154(b) by 245 days.

(21) Appl. No.: 18/398,422

(22) Filed: Dec. 28, 2023

(65) Prior Publication Data

US 2024/0128948 A1 Apr. 18, 2024

Related U.S. Application Data

(63) Continuation of application No. PCT/JP2022/007130, filed on Feb. 22, 2022.

(30) Foreign Application Priority Data

Jul. 29, 2021 (JP) ................................ 2021-124547

(51) Int. Cl.
*H03H 9/10* (2006.01)
*H03H 3/007* (2006.01)
*H03H 9/24* (2006.01)

(52) U.S. Cl.
CPC ........ *H03H 9/1057* (2013.01); *H03H 3/0072* (2013.01); *H03H 9/2489* (2013.01)

(58) Field of Classification Search
CPC ........ H03H 3/007; H03H 3/0072; H03H 3/02; H03H 9/02; H03H 9/0595; H03H 9/1057; H03H 9/19; H03H 9/24; H03H 9/2489
See application file for complete search history.

(56) References Cited

U.S. PATENT DOCUMENTS 10,800,650 B1 10/2020 Grosjean et al.
2012/0056513 A1* 3/2012 Ueno .................... H03H 9/131 310/344

(Continued)

FOREIGN PATENT DOCUMENTS

CN 112039472 A * 12/2020 .............. H03H 3/02
JP 2013059855 A 4/2013

(Continued)

OTHER PUBLICATIONS

Translation for CN112039472.*

(Continued)

*Primary Examiner* — Christopher M Koehler
*Assistant Examiner* — Ethan Nguyen Vo
(74) *Attorney, Agent, or Firm* — ArentFox Schiff LLP

(57) ABSTRACT

A resonance device that includes: a first substrate having a first silicon substrate and a resonator, wherein the resonator includes a single-crystal silicon film and a first silicon oxide film interposed between the single-crystal silicon film and the first silicon substrate, and a through hole that passes through the single-crystal silicon film and the first silicon oxide film; a second substrate opposite the first substrate; a frame shaped bonding portion that bonds the first substrate to the second substrate to seal a vibration space of the resonator; and a first blocking member disposed in an interior of the through hole and surrounding a vibration portion of the resonator in a plan view of the first substrate so as to divide the first silicon oxide film, wherein the first blocking member has a lower helium permeability than the first silicon oxide film.

20 Claims, 10 Drawing Sheets

(56) References Cited

U.S. PATENT DOCUMENTS

| | | | |
|---|---|---|---|
| 2013/0025931 A1 | 1/2013 | Oyama et al. | |
| 2013/0214366 A1 | 8/2013 | Naito et al. | |
| 2015/0259193 A1 | 9/2015 | Yoshizawa | |
| 2018/0127268 A1 | 5/2018 | Fukumitsu et al. | |
| 2019/0245515 A1* | 8/2019 | Hurwitz | H03H 9/173 |
| 2021/0371273 A1 | 12/2021 | Fukumitsu et al. | |

FOREIGN PATENT DOCUMENTS

| | | | | |
|---|---|---|---|---|
| JP | 2015145038 A | 8/2015 | | |
| JP | 2015171740 A | 10/2015 | | |
| JP | 2018031714 A | 3/2018 | | |
| WO | 2011125414 A1 | 10/2011 | | |
| WO | 2017047663 A1 | 3/2017 | | |
| WO | WO-2020194810 A1 * | 10/2020 | | H03H 9/2489 |

OTHER PUBLICATIONS

Translation for WO2020194810.*
International Search Report in PCT/JP2022/007130, mailed May 10, 2022, 3 pages.

* cited by examiner

RESONANCE DEVICE AND METHOD FOR MANUFACTURING SAME

CROSS REFERENCE TO RELATED APPLICATIONS

The present application is a continuation of International application No. PCT/JP2022/007130, filed Feb. 22, 2022, which claims priority to Japanese Patent Application No. 2021-124547, filed Jul. 29, 2021, the entire contents of each of which are incorporated herein by reference.

TECHNICAL FIELD

The present invention relates to a resonance device and a method for manufacturing the same.

BACKGROUND ART

Resonance devices are used for various applications, such as timing devices, sensors, and oscillators, in various electronic apparatuses, such as mobile communication terminals, communication base stations, and home appliances. A so-called MEMS (Micro Electro Mechanical Systems) resonance device including a lower lid, an upper lid for forming a vibration space between the lower lid and the upper lid, and a resonator having a vibration arm held in the vibration space so as to be capable of vibrating is one type of known resonance devices.

International Publication No. 2020/194810 (hereinafter "Patent Document 1") discloses a resonance device including a first substrate having a resonator, a second substrate, and a bonding portion for bonding the first substrate to the second substrate, wherein the first substrate and the second substrate include a silicon oxide film on the respective surfaces opposite each other, a frame-like through hole surrounding a vibration portion of the resonator is formed in each of the silicon oxide films, and the interior of each of the through holes is filled with a metal constituting the bonding portion.

U.S. Pat. No. 10,800,650 (hereinafter "Patent Document 2") discloses MEMS including a silicon handle wafer, a bottom oxide disposed on the silicon handle wafer, a silicon device layer disposed on the bottom-oxide, a middle-oxide layer disposed on the silicon device layer, lid-layer silicon disposed on the middle-oxide, a first barrier for blocking hydrogen and helium, a path of entry of which is the bottom-oxide, and a second barrier for blocking hydrogen and helium, a path of entry of which is the middle-oxide, wherein the first barrier penetrates the bottom-oxide, the second barrier penetrates the middle-oxide, and the first barrier and the second barrier are formed surrounding a MEMS cavity formed in the silicon device layer.

SUMMARY OF THE INVENTION

According to the invention described in Patent Document 1, since the silicon oxide films disposed on the surfaces opposite each other of the first substrate and the second substrate are divided by the metal constituting the bonding portion, a helium gas is suppressed from entering through the silicon oxide film. Therefore, deterioration in vibration characteristics such as Q value due to decrease in the degree of vacuum in a vibration space of the resonator is suppressed from occurring.

However, when a silicon oxide film is present not only on the surfaces opposite each other of the first substrate and the second substrate but also in the interiors and the like of the substrates, a helium gas is not limited to being sufficiently suppressed from entering in the resonance device described in Patent Document 1.

In the invention described in Patent Document 2, for example, the silicon device layer is disposed on the bottom-oxide and the first barrier by bonding or growing.

When the silicon device layer is disposed by bonding, at a stage in which the first barrier is formed on the bottom-oxide, the surfaces of the bottom-oxide and the first barrier are planarized by polishing or the like. However, since the bottom-oxide differs from the first barrier in the hardness, the surface of the first barrier may become concave or convex relative to the bottom-oxide. In such an instance, a gap may be generated between the bottom-oxide and the silicon device layer or between the first barrier and the silicon device layer, and there is a concern that a problem of the gap serving as a path of entry of helium may occur.

In addition, when the silicon device layer is disposed by growing, since the silicon device layer is formed of polycrystalline silicon or amorphous silicon, there is a concern that a problem of frequency temperature characteristics deteriorating compared with the silicon device layer formed of single-crystal silicon may occur.

The present invention was realized in consideration of such circumstances, and it is an object of the present invention to provide a resonance device capable of suppressing the degree of vacuum from decreasing and capable of having favorable frequency temperature characteristics and to provide a method for manufacturing the same.

A resonance device according to an aspect of the present invention includes: a first substrate having a first silicon substrate and a resonator, wherein the resonator includes a single-crystal silicon film and a first silicon oxide film interposed between the single-crystal silicon film and the first silicon substrate, and a through hole that passes through the single-crystal silicon film and the first silicon oxide film; a second substrate opposite the first substrate; a frame shaped bonding portion that bonds the first substrate to the second substrate to seal a vibration space of the resonator; and a first blocking member disposed in an interior of the through hole and surrounding a vibration portion of the resonator in a plan view of the first substrate so as to divide the first silicon oxide film, wherein the first blocking member has a lower helium permeability than the first silicon oxide film.

A resonance device according to another aspect of the present invention includes a first substrate having a resonator; a second substrate opposite the first substrate, the second substrate including a silicon substrate, a penetration electrode that penetrates the silicon substrate, an internal terminal on a first substrate side of the penetration electrode, an external terminal opposite to the first substrate side of the penetration electrode, and a silicon oxide film extending continuously over a region between the silicon substrate and the penetration electrode, an inner region between the silicon substrate and the internal terminal, and an outer region between the silicon substrate and the external terminal; a bonding portion that bonds the first substrate to the second substrate to seal a vibration space of the resonator; and a blocking member surrounding the penetration electrode in a plan view of the second substrate in the inner region and dividing the silicon oxide film, and the blocking member has a lower helium permeability than the silicon oxide film.

A method for manufacturing a resonance device according to another aspect of the present invention includes: preparing a first substrate having a silicon substrate and a resonator, wherein the resonator includes a single-crystal silicon film and a silicon oxide film interposed between the single-crystal silicon film and the silicon substrate; preparing a second substrate; forming a through hole that passes through the single-crystal silicon film and the silicon oxide film in the resonator of the first substrate; disposing a blocking member in an interior of the through hole so as to surround the vibration portion of the resonator in a plan view of the first substrate and divide the silicon oxide film, the blocking member having a lower helium permeability than the silicon oxide film; and bonding the first substrate to the second substrate to seal a vibration space of the resonator.

According to the present invention, a resonance device capable of suppressing the degree of vacuum from decreasing and capable of having favorable frequency temperature characteristics and a manufacturing method of the same can be provided.

DETAILED DESCRIPTION OF THE PREFERRED EMBODIMENTS

The embodiments according to the present invention will be described below with reference to the drawings. The drawings of the embodiments are exemplifications, dimensions and shapes of portions are schematic, and it should be understood that the technical scope of the present invention is not limited to the embodiments.

First Embodiment

Figure 1:
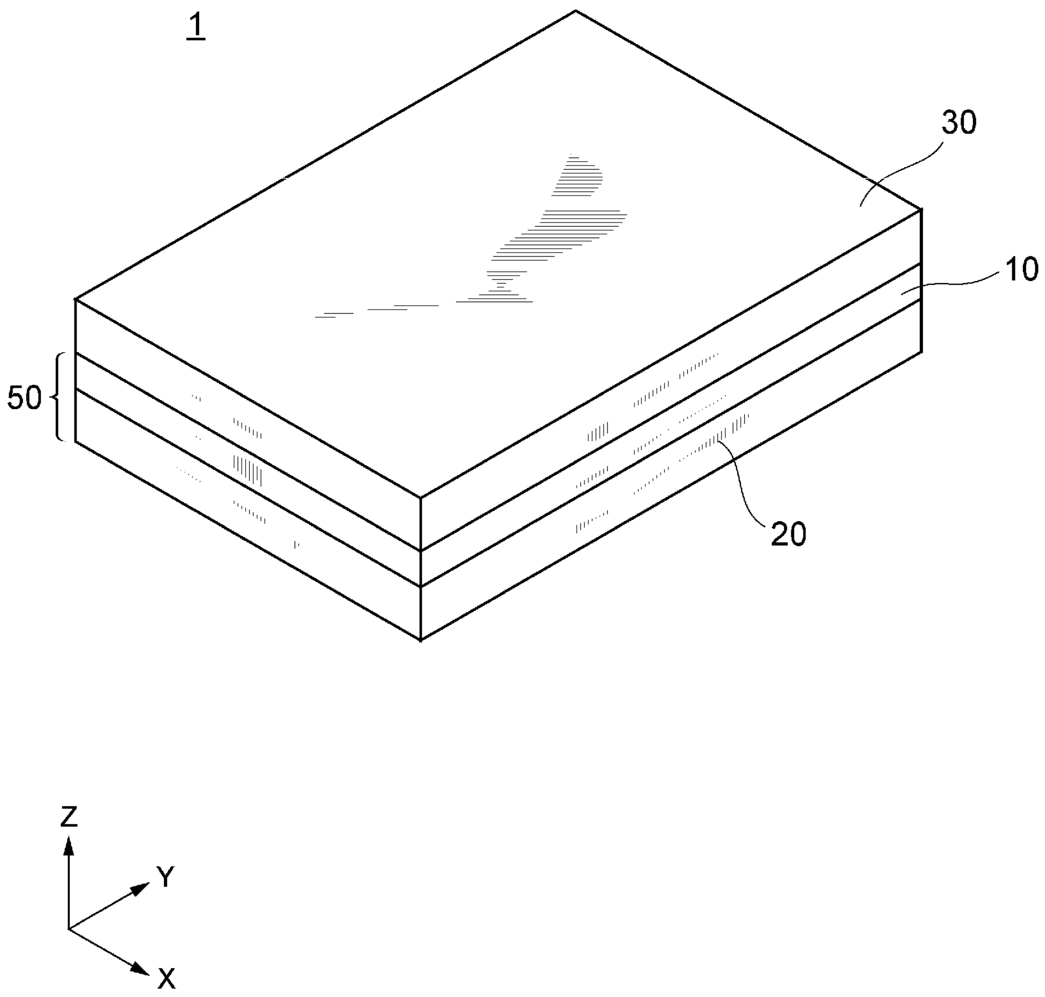
FIG. 1 is a schematic perspective view illustrating the appearance of a resonance device according to a first embodiment.
Figure 2:
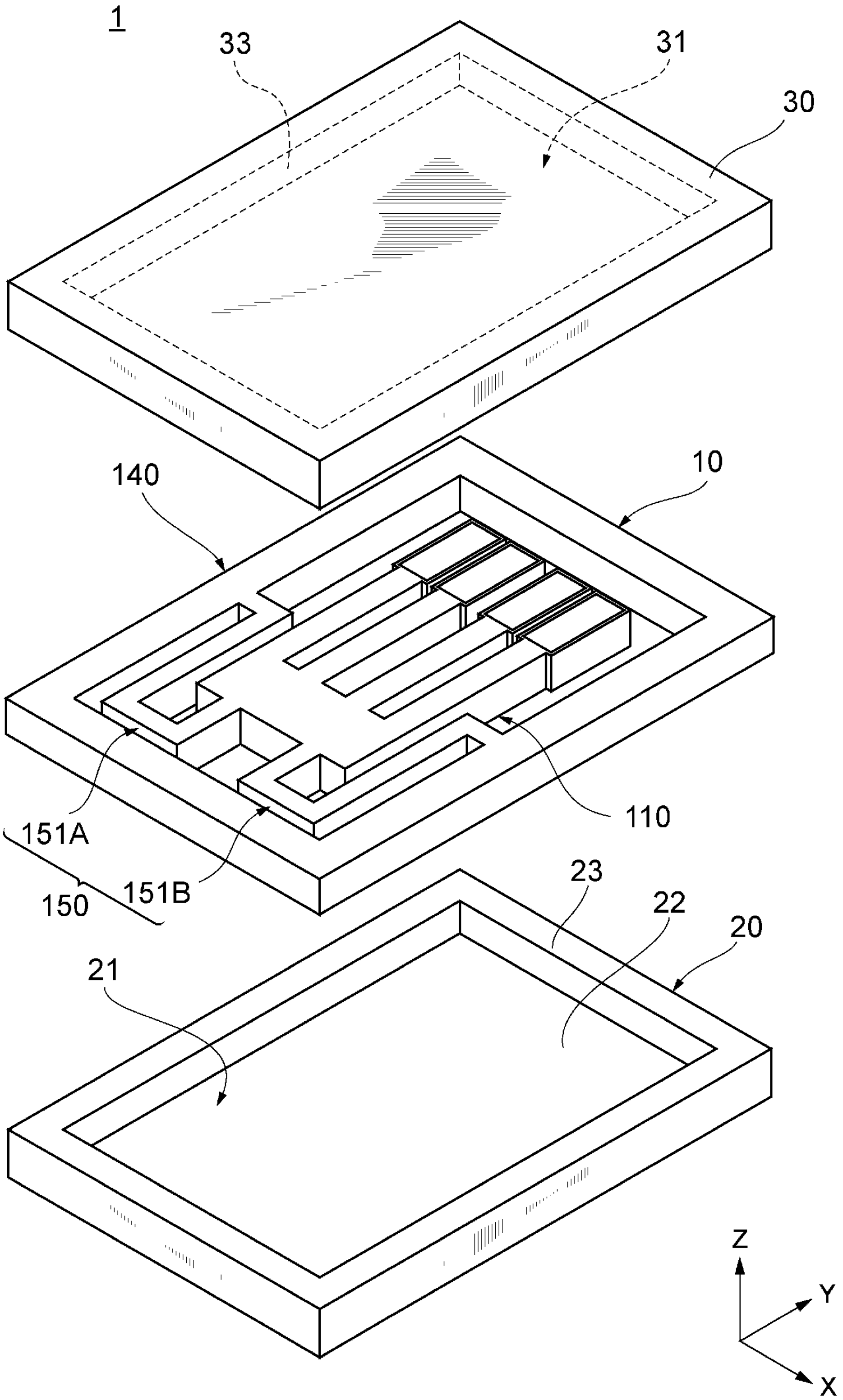
FIG. 2 is a schematic exploded perspective view illustrating the structure of the resonance device according to the first embodiment.

To begin with, the configuration of a resonance device 1 according to a first embodiment of the present invention will be described with reference to FIG. 1 and FIG. 2. FIG. 1 is a schematic perspective view illustrating the appearance of the resonance device according to the first embodiment. FIG. 2 is a schematic exploded perspective view illustrating the structure of the resonance device according to the present embodiment.

Each configuration of the resonance device 1 will be described below. An orthogonal coordinate system expediently composed of the X-axis, the Y-axis, and the Z-axis may be added to the drawings for the sake of clarifying the relationship between the drawings and of understanding the positional relationship between the members. The directions parallel to the X-axis, the Y-axis, and the Z-axis are referred to as X-axis direction, Y-axis direction, and Z-axis direction, respectively. A plane determined by the X-axis and the Y-axis is referred to as XY-plane, and the same applies to YZ-plane and ZX-plane.

The resonance device 1 includes a resonator 10, a lower lid 20, and an upper lid 30, the lower lid 20 and the upper lid 30 being disposed so as to oppose each other with the resonator 10 interposed therebetween. The lower lid 20, the resonator 10, and the upper lid 30 are stacked in this order in the Z-axis direction. The resonator 10 is bonded to the lower lid 20 so as to constitute a MEMS substrate 50. The upper lid 30 is bonded to the resonator 10 side of the MEMS substrate 50. In other words, the upper lid 30 is bonded to the lower lid 20 with the resonator 10 interposed therebetween. The lower lid 20 and the upper lid 30 constitute a package structure having a vibration space in the interior. The MEMS substrate 50 corresponds to an example of "first substrate" according to the present disclosure, and the upper lid 30 corresponds to an example of "second substrate" according to the present disclosure.

The resonator 10 is a MEMS vibration element produced by using MEMS technology. The frequency band of the resonator 10 is, for example, 1 kHz to 1 MHz. The resonator 10 includes a vibration portion 110, a holding portion 140, and a holding arm 150.

The vibration portion 110 is held in the vibration space formed between the lower lid 20 and the upper lid 30 so as to be capable of vibrating. The vibration portion 110 extends along the XY-plane during non-vibration (in the state in which voltage is not applied) and performs bending vibration in the Z-axis direction during vibration (in the state in which voltage is applied). That is, the vibration portion 110 is vibrated in an out-of-plane bending vibration mode. In this regard, the vibration portion 110 during non-vibration may bend under its own weight in the Z-direction.

The holding portion 140 is disposed having a frame-like shape surrounding the vibration portion 110 in plan view of, for example, the XY-plane (hereafter referred to simply as "in plan view"). The holding portion 140 forms, with the lower lid 20 and the upper lid 30, a vibration space of a package structure.

The holding arm 150 is disposed between the vibration portion 110 and the holding portion 140 in plan view. The holding arm 150 bonds the vibration portion 110 to the holding portion 140.

The lower lid 20 includes a rectangular plate-like bottom plate 22 having a principal surface extending along the XY-plane and a side wall 23 extending from the peripheral portion of the bottom plate 22 toward the upper lid 30. The side wall 23 is bonded to the holding portion 140 of the resonator 10. In the lower lid 20, a cavity 21 surrounded by the bottom plate 22 and the side wall 23 is formed on the side opposite the vibration portion 110 of the resonator 10. The cavity 21 is a rectangular parallelepiped cavity open upward.

The upper lid 30 includes a rectangular plate-like bottom plate 32 having a principal surface extending along the XY-plane and a side wall 33 extending from the peripheral portion of the bottom plate 32 toward the lower lid 20. The side wall 33 is bonded to the holding portion 140 of the resonator 10. In the upper lid 30, a cavity 31 surrounded by the bottom plate 32 and the side wall 33 is formed on the side opposite the vibration portion 110 of the resonator 10. The cavity 31 is a rectangular parallelepiped cavity open downward. The cavity 21 and the cavity 31 oppose each other with the vibration portion 110 of the resonator 10 interposed therebetween and form the vibration space of the package structure.

Figure 3:
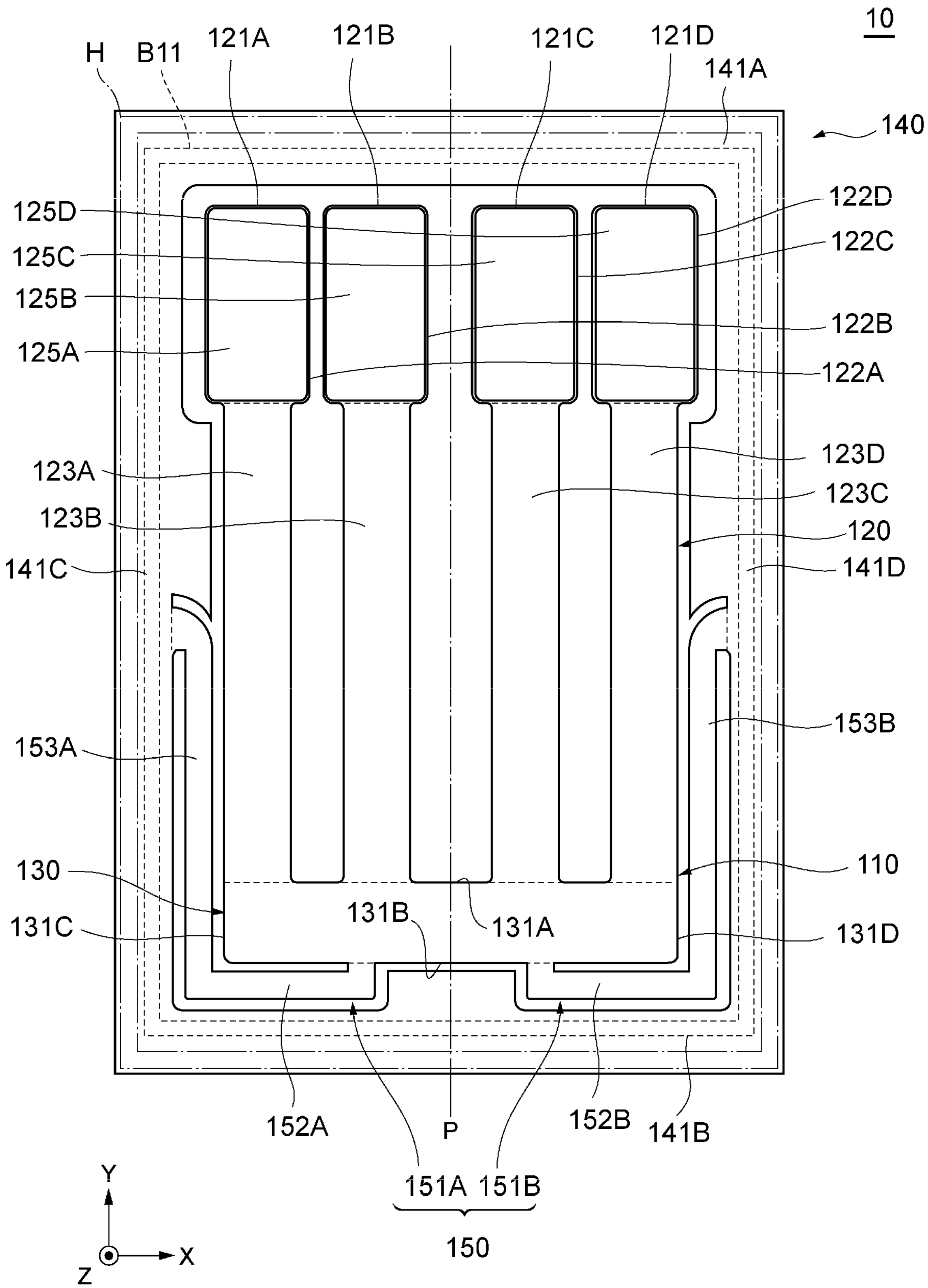
FIG. 3 is a schematic plan view illustrating the structure of a resonator according to the first embodiment.

Next, the configuration of the resonator 10 (the vibration portion 110, the holding portion 140, and the holding arm 150) in plan view from the upper lid 30 side will be described in more detail with reference to FIG. 3. FIG. 3 is a schematic plan view illustrating the structure of the resonator according to the present embodiment. Herein, the dimension in the Y-axis direction is denoted by "length", and the dimension In the X-axis direction is denoted by "width".

The resonator 10 is formed plane-symmetrically with respect to, for example, a virtual plane P parallel to the YZ-plane. That is, each of the vibration portion 110, the holding portion 140, and the holding arm 150 is formed substantially plane-symmetrically with respect to the virtual plane P.

The vibration portion 110 is disposed inside the holding portion 140 in plan view from the upper lid 30 side. A space is formed as predetermined clearance between the vibration portion 110 and the holding portion 140. The vibration portion 110 includes an excitation portion 120 composed of four vibration arms 121A, 121B, 121C, and 121D and a base portion 130 connected to the excitation portion 120. In this regard, the number of vibration arms is not limited to four and may be set to be an optional number of 1 or more. In the present embodiment, the excitation portion 120 and the base portion 130 are integrally formed.

Each of the vibration arms 121A to 121D extends in the Y-axis direction and is arranged in this order in the X-axis direction at a predetermined interval. The vibration arms 121A to 121D have a fixed end connected to the base portion 130 and an open end furthest from the base portion 130. The vibration arms 121A to 121D have top end portions 122A to 122D, respectively, disposed on the open end side with relatively large displacement in the vibration portion 110 and arm portions 123A to 123D, respectively, for connecting the base portion 130 to the top end portions 122A to 122D. The virtual plane P is located between the vibration arm 121B and the vibration arm 121C.

Of the four vibration arms 121A to 121D, the vibration arms 121A and 121D are outer vibration arms arranged on the outer side in the X-axis direction, and the vibration arms 121B and 121C are inner vibration arms arranged on the inner side in the X-axis direction. With respect to the virtual plane P, structures of the inner vibration arm 121B and the inner vibration arm 121C are symmetric with each other, and the structures of the outer vibration arm 121A and the outer vibration arm 121D are symmetric with each other.

The top end portions 122A to 122D include metal films 125A to 125D, respectively, on the upper lid 30-side surfaces. The metal films 125A to 125D function as mass addition films for increasing the mass per unit length (hereafter referred to simply as a "mas") of the top end portions 122A to 122D, respectively, to more than the mass of the arm portions 123A to 123D, respectively. The mass of the top end portion being increased to more than the mass of the arm portion enables the vibration portion 110 to be reduced in size and enables the amplitude to be increased. In addition, the metal films 125A to 125D may be used as a so-called frequency-adjusting film which adjusts the resonant frequency by a portion of itself being cut.

The top end portion 122A equally protrudes from the arm portion 123A in both the positive direction and the negative direction of the X-axis direction. Therefore, the width of the top end portion 122A is more than the width of the arm portion 123A. The same applies to the top end portions 122B to 122D and the arm portions 123B to 123D. Consequently, the weight of each of the top end portions 122A to 122D can be further increased. However, the width of each of the top end portions 122A to 122D may be less than or equal to the width of each of the arm portions 123A to 123D provided that the weight of each of the top end portions 122A to 122D is more than the weight of each of the arm portions 123A to 123D.

The shape of each of the top end portions 122A to 122D is a substantially rectangular shape in which four rounded corners have a curved surface shape (for example, a so-called R-shape). The shape of each of the arm portions 123A to 123D is a substantially rectangular shape in which the vicinity of the root portion connected to the base portion 130 and the vicinity of the connection portion connected to each of the top end portions 122A to 122D have R-shapes. However, the shape of each of the top end portions 122A to 122D and each of the arm portions 123A to 123D are not limited to the above. For example, the shape of each of the top end portions 122A to 122D may be a trapezoidal shape or the shape of the letter L. In addition, the shape of each of the arm portions 123A to 123D may be a trapezoidal shape, or a slit or the like may be formed.

The shapes and the sizes of the vibration arms 121A to 121D are substantially the same with each other. The length of each of the vibration arms 121A to 121D is, for example, about 450 μm. For example, the length of each of the arm portions 123A to 123D is about 300 μm, and the width of each of them is about 50 μm. For example, the length of each of the top end portions 122A to 122D is about 150 μm, and the width of each of them is about 70 μm.

The base portion 130 has a front end portion 131A, a rear end portion 131B, a left end portion 131C, and a right end portion 131D. Each of the front end portion 131A, the rear end portion 131B, the left end portion 131C, and the right end portion 131D is a portion of the outer edge portion of the base portion 130. The front end portion 131A is an end portion extending in the X-axis direction on the vibration arms 121A to 121D side. The rear end portion 131B is an end portion extending in the X-axis direction on the opposite side of the vibration arms 121A to 121D. The left end portion 131C is an end portion extending in the Y-axis direction on the vibration arm 121A side when viewed from the vibration arm 121D. The right end portion 131D is an end portion extending in the Y-axis direction on the vibration arm 121D side when viewed from the vibration arm 121A. The front end portion 131A is connected to the vibration arms 121A to 121D.

The shape of the base portion 130 is a substantially rectangular shape in which the front end portion 131A and the rear end portion 131B are long sides, and the left end portion 131C and the right end portion 131D are short sides. The virtual plane P is defined along the perpendicular bisector of each of the front end portion 131A and the rear end portion 131B. The base portion 130 is not limited to the above provided that the structure is substantially symmetric with respect to the virtual plane P. For example, the shape may be a trapezoidal shape in which one of the front end portion 131A and the rear end portion 131B is longer than the other. In addition, at least one of the front end portion 131A, the rear end portion 131B, the left end portion 131C, and the right end portion 131D may be bent or curved.

A base portion length which is a maximum distance between the front end portion 131A and the rear end portion 131B in the Y-axis direction is, for example, about 35 μm. In addition, a base portion width which is a maximum distance between the left end portion 131C and the right end portion 131D in the X-axis direction is, for example, about 265 μm. In this regard, in the configuration example illustrated in FIG. 3, the base portion length corresponds to the length of the left end portion 131C or the right end portion 131D, and the base portion width corresponds to the width of the front end portion 131A or the rear end portion 131B.

The holding portion 140 is a portion for holding the vibration portion 110 in the vibration space formed by the lower lid 20 and the upper lid 30 and has, for example, a frame-like shape so as to surround the vibration portion 110. As illustrated in FIG. 3, the holding portion 140 has a front frame 141A, a rear frame 141B, a left frame 141C, and a right frame 141D in plan view from the upper lid 30 side. Each of the front frame 141A, the rear frame 141B, the left frame 141C, and the right frame 141D is a portion of a substantially rectangular frame surrounding the vibration portion 110. Specifically, the front frame 141A is a portion extending in the X-axis direction on the excitation portion 120 side when viewed from the base portion 130. The rear frame 141B is a portion extending in the X-axis direction on the base portion 130 side when viewed from the excitation portion 120. The left frame 141C is a portion extending in the Y-axis direction on the vibration arm 121A side when viewed from the vibration arm 121D. The right frame 141D is a portion extending in the Y-axis direction on the vibration arm 121D side when viewed from the vibration arm 121A. Each of the front frame 141A and the rear frame 141B is divided into two equal parts by the virtual plane P.

Two ends of the left frame 141C is connected to one end of the front frame 141A and one end of the rear frame 141B. Two ends of the right frame 141D is connected to the other end of the front frame 141A and the other end of the rear frame 141B. The front frame 141A and the rear frame 141B are opposite each other in the Y-axis direction with the vibration portion 110 interposed therebetween. The left frame 141C and the right frame 141D are opposite each other in the X-axis direction with the vibration portion 110 interposed therebetween.

The holding arm 150 is disposed inside the holding portion 140 and connects the base portion 130 to the holding portion 140. In the configuration example illustrated in FIG. 3, the holding arm 150 has a left holding arm 151A and a right holding arm 151B in plan view from the upper lid 30 side. The virtual plane P is located between the right holding arm 151B and the left holding arm 151A, and the right holding arm 151B and the left holding arm 151A are plane-symmetric with each other.

The left holding arm 151A connects the rear end portion 131B of the base portion 130 to the left frame 141C of the holding portion 140. The right holding arm 151B connects the rear end portion 131B of the base portion 130 to the right frame 141D of the holding portion 140. The left holding arm 151A has a holding rear arm 152A and a holding side arm 153A, and the right holding arm 151B has a holding rear arm 152B and a holding side arm 153B.

The holding rear arms 152A and 152B extend from the rear end portion 131B of the base portion 130 between the rear end portion 131B of the base portion 130 and the holding portion 140. Specifically, the holding rear arm 152A extends from the rear end portion 131B of the base portion 130 toward the rear frame 141B and is bent so as to extend toward the left frame 141C. The holding rear arm 152B extends from the rear end portion 131B of the base portion 130 toward the rear frame 141B and is bent so as to extend toward the right frame 141D. The width of each of the holding rear arms 152A and 152B is less than the width of each of the vibration arms 121A to 121D.

The holding side arm 153A extends along the outer vibration arm 121A between the outer vibration arm 121A and the holding portion 140. The holding side arm 153B extends along the outer vibration arm 121D between the outer vibration arm 121D and the holding portion 140. Specifically, the holding side arm 153A extends from the end portion of the left frame 141C side of the holding rear arm 152A toward the front frame 141A and is bent so as to be connected to the left frame 141C. The holding side arm 153B extends from the end portion of the right frame 141D side of the holding rear arm 152B toward the front frame 141A and is bent so as to be connected to the right frame 141D. The width of each of the holding side arms 153A and 153B is substantially equal to the width of the holding rear arms 152A and 152B.

In this regard, the holding arm 150 is not limited to have the above-described configuration. For example, the holding arm 150 may be connected to the left end portion 131C and the right end portion 131D of the base portion 130. Alternatively, the holding arm 150 may be connected to the front frame 141A or rear frame 141B of the holding portion 140. In this regard, the number of the holding arm 150 may be 1 or may be 3 or more.

As illustrated in FIG. 3, the resonator 10 includes a blocking member B11. In plan view, the blocking member B11 is formed having a frame-like shape surrounding the vibration portion 110. In addition, the blocking member B11 is disposed in the holding portion 140 and surrounds the cavity 21. The blocking member B11 is continuous in the circumferential direction. Specifically, of the blocking member B11, a portion disposed on the front frame 141A connects one end of a portion disposed on the left frame 141C to one end of a portion disposed on the right frame 141D, and a portion disposed on the rear frame 141B connects the other end of the portion disposed on the left frame 141C to the other end of the portion disposed on the right frame 141D. In plan view, the blocking member B11 is disposed in a region surrounded by a bonding portion H described later, that is, inside the bonding portion H. However, the blocking member B11 may be disposed overlapping the bonding portion H. In this regard, the blocking member B11 may also be disposed on the region nearer than the bonding portion H to the outer edge portion of the resonator 10, that is, outside the bonding portion H.

Figure 4:
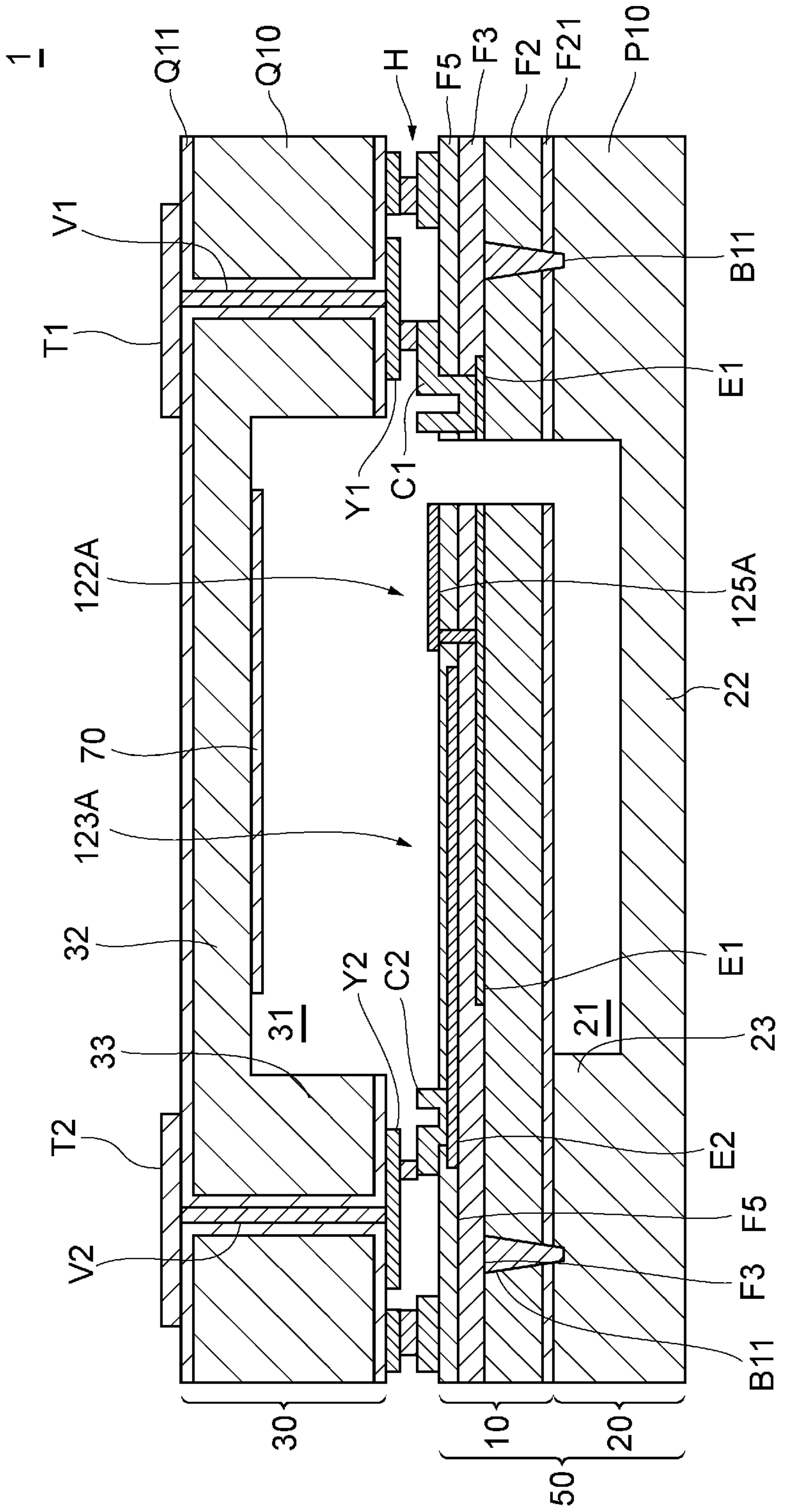
FIG. 4 is a conceptual sectional view illustrating the multilayer structure of the resonance device according to the first embodiment.

Next, the multilayer structure of the resonance device 1 according to the first embodiment will be described with reference to FIG. 4. FIG. 4 is a conceptual sectional view illustrating the multilayer structure of the resonance device according to the first embodiment. In this regard, FIG. 4 is a drawing for conceptually illustrating the multilayer structure of the resonance device 1, and constituent members are not limited to being located on the cross section in the same plane. Herein, the direction from the lower lid 20 toward the upper lid 30 is assumed to be "up or upward", and the direction from the upper lid 30 to the lower lid 20 is assumed to be "down or downward".

The resonator 10 is held between the lower lid 20 and the upper lid 30. Specifically, the holding portion 140 of the resonator 10 is connected to each of a side wall 23 of the lower lid 20 and a side wall 33 of the upper lid 30.

Consequently, the vibration space in which the vibration portion 110 can be vibrated is formed by the lower lid 20, the upper lid 30, and the holding portion 140. Each of the resonator 10, the lower lid 20, and the upper lid 30 is formed using silicon (Si), as an example. In this regard, each of the resonator 10, the lower lid 20, and the upper lid 30 may be formed using a SOI (Silicon On Insulator) substrate in which a silicon layer and a silicon oxide film are stacked. Alternatively, each of the resonator 10, the lower lid 20, and the upper lid 30 may be formed using a substrate other than the silicon substrate, such as a compound semiconductor substrate, a glass substrate, a ceramic substrate, or a resin substrate, provided that the substrate can be worked by micromachining technology.

The vibration portion 110, the holding portion 140, and the holding arm 150 are integrally formed through the same process. The resonator 10 includes a silicon oxide film F21, a silicon substrate F2, a metal film E1, a piezoelectric film F3, a metal film E2, and a protective film F5. In the top end portions 122A to 122D, the resonator 10 further includes the above-described metal films 125A to 125D. The resonator 10 is formed by patterning a multilayer body composed of the silicon substrate F2, the metal film E1, the piezoelectric film F3, the metal film E2, the protective film F5, and the like based on a removal process. The removal process is, for example, dry etching in which an argon (Ar) ion beam is applied.

The silicon oxide film F21 is disposed on the lower surface of the silicon substrate F2 and is interposed between a silicon substrate P10 and the silicon substrate F2. The silicon oxide film F21 is formed of, for example, silicon oxide containing $SiO_2$ or the like. A portion of the silicon oxide film F21 is exposed to the cavity 21 of the lower lid 20, that is, the vibration space of the resonator 10. The silicon oxide film F21 functions as a temperature characteristics correction layer for decreasing a temperature coefficient of the resonant frequency, that is, a resonant frequency change rate per unit temperature, of the resonator 10 at least in the vicinity of normal temperature. Therefore, the silicon oxide film F21 improves the temperature characteristics of the resonator 10. In this regard, the silicon oxide film may be formed on the upper surface of the silicon substrate F2 or may be formed on both the upper surface and the lower surface of the silicon substrate F2. The silicon oxide film F21 corresponds to an example of a "first silicon oxide film" according to the present disclosure.

The silicon substrate F2 is a single crystal of silicon and is formed of, for example, a degenerate n-type silicon (Si) semiconductor having a thickness of about 6 μm. The silicon substrate F2 can contain phosphorus (P), arsenic (As), antimony (Sb), or the like as an n-type dopant. The resistance value of degenerate silicon (Si) used for the silicon substrate F2 is, for example, less than 16 mΩ·cm and more desirably 1.2 mΩ·cm or less. The silicon substrate F2 corresponds to an example of a "single-crystal silicon film" according to the present disclosure.

The metal film E1 is stacked on the silicon substrate F2, the piezoelectric film F3 is stacked on the metal film E1, and the metal film E2 is stacked on the piezoelectric film F3. Each of the metal films E1 and E2 has a portion that functions as an excitation electrode for exciting the vibration arms 121A to 121D and a portion that functions as an extended electrode for electrically coupling the excitation electrode to an external power supply. The portions that function as the excitation electrode of the metal films E1 and E2 are opposite each other with the piezoelectric film F3 interposed therebetween in the arm portions 123A to 123D of the vibration arms 121A to 121D. The portions that function as the extended electrodes of the metal films E1 and E2 are extended, for example, from the base portion 130 to the holding portion 140 through the holding arm 150. The metal film E1 is electrically continuous over the entire resonator 10. Regarding the metal film E2, portions formed on the outer vibration arms 121A and 121D are electrically separated from portions formed on the inner vibration arms 121B and 121C. The metal film E1 corresponds to an example of a "lower electrode" according to the present disclosure, and the metal film E2 corresponds to an example of an "upper electrode" according to the present disclosure.

The thickness of each of the metal films E1 and E2 is, for example, about 0.1 μm to 0.2 μm. The metal films E1 and E2 are patterned into the excitation electrode or the extended electrode by a removal process such as etching after film formation. The metal films E1 and E2 are formed of, for example, a metal material having a crystal structure that is a body-centered cubic structure. Specifically, the metal films E1 and E2 are formed of Mo (molybdenum), tungsten (W), or the like. When the silicon substrate F2 is a degenerate semiconductor substrate having high electrical conductivity, the metal film E1 may be skipped, and the silicon substrate F2 may function as the lower electrode. In this regard, from the viewpoint of suppressing a parasitic capacity and short-circuit at the end portion of the resonance device 1 from occurring, an insulating film may be disposed between the metal film E1 and the silicon substrate F2. Such an insulating film may be formed of the same material as the silicon oxide film F21 or may be formed of the same material as the piezoelectric film F3.

The piezoelectric film F3 is a thin film formed of a piezoelectric body which performs interconversion between the electrical energy and the mechanical energy. The piezoelectric film F3 extends and shrinks in the Y-axis direction in the in-plane direction of the XY-plane in accordance with an electric field applied by the metal films E1 and E2. Due to extension and shrinkage of the piezoelectric film F3, the vibration arms 121A to 121D are bent, and the open ends thereof are displaced toward the bottom plate 22 of the lower lid 20 and the bottom plate 32 of the upper lid 30. Alternating voltages having phases opposite to each other are applied to the upper electrode of the outer vibration arms 121A and 121D and the upper electrode of the inner vibration arms 121B and 121C. Therefore, the outer vibration arms 121A and 121D and the inner vibration arms 121B and 121C vibrate with phases opposite to each other. For example, when the open ends of the outer vibration arms 121A and 121D are displaced toward the lower lid 20, the open ends of the inner vibration arms 121B and 121C are displaced toward the upper lid 30. A torsional moment around a rotation axis extending in the Y-axis direction is generated in the vibration portion 110 due to such vibration with phases opposite to each other. The base portion 130 is bent due to the torsional moment, and the left end portion 131C and the right end portion 131D are displaced toward the lower lid 20 or the upper lid 30. That is, the vibration portion 110 of the resonator 10 is vibrated in an out-of-plane bending vibration mode.

The piezoelectric film F3 is formed of a material having a crystal structure of a wurzite-type hexagonal crystal structure, and the primary component can be a nitride or an oxide, for example, aluminum nitride (AlN), scandium aluminum nitride (ScAlN), zinc oxide (ZnO), gallium nitride (GaN), or indium nitride (InN). In this regard, scandium aluminum nitride is aluminum nitride in which a portion of aluminum is substituted with scandium, and a portion of aluminum may be substituted with two elements, such as magnesium (Mg) and niobium (Nb), or magnesium (Mg) and zirconium (Zr) instead of scandium. The thickness of the piezoelectric film F3 is, for example, about 1 μm and may be about 0.2 μm to 2 μm.

The protective film F5 is stacked on the metal film E2. The protective film F5 protects, for example, the metal film E2 from oxidation. A material for forming the protective film F5 is, for example, an oxide, a nitride, or an oxynitride containing aluminum (Al), silicon (Si), or tantalum (Ta). A parasitic-capacity-decreasing film for decreasing a parasitic capacity formed between internal wiring lines of the resonator 10 may be stacked on the protective film F5.

The metal films 125A to 125D are stacked on the protective film F5 in the front end portions 122A to 122D. The metal films 125A to 125D function as a mass addition film and also function as a frequency-adjusting film. From the viewpoint of the frequency-adjusting film, it is desirable that the metal films 125A to 125D be formed of a material which exhibits a higher mass-decreasing rate due to etching than the protective film F5. The mass-decreasing rate is represented by a product of an etching rate and a density. The etching rate is a thickness removed per unit time. The magnitude relationship of the etching rate is optional provided that the relationship of the mass-decreasing rate between the protective film F5 and the metal films 125A to 125D is as described above. In addition, from the viewpoint of the mass addition film, it is desirable that the metal films 125A to 125D be formed of a material having a large specific gravity. From the above-described two viewpoints, the material for forming the metal films 125A to 125D is a metal material, such as molybdenum (Mo), tungsten (W), gold (Au), platinum (Pt), nickel (Ni), or titanium (Ti). In this regard, when the metal films 125A to 125D are used as the frequency-adjusting film, a portion of the protective film F5 may be removed simultaneously with trimming treatment of the metal films 125A to 125D. In such an instance, the protective film F5 also corresponds to the frequency-adjusting film.

A portion of each of the metal films 125A to 125D is removed by the trimming treatment in the step of adjusting the frequency. The trimming treatment of the metal films 125A to 125D is, for example, dry etching in which an argon (Ar) ion beam is applied. The ion beam can be applied to a wide range and, therefore, has an excellent working efficiency. However, there is a concern that the metal films 125A to 125D may be charged. To prevent the vibration characteristics of the resonator 10 from deteriorating due to a change of vibration orbitals of the vibration arms 121A to 121D by coulomb interaction in accordance with charging of the metal films 125A to 125D, it is desirable that the metal films 125A to 125D are grounded. Consequently, the metal film 125A is electrically coupled to the metal film E1 by the penetration electrode that penetrates the piezoelectric film F3 and the protective film F5. Likewise, the metal films 125B to 125D not illustrated in the drawing are also electrically coupled to the metal film E1 by the penetration electrodes. In this regard, the metal films 125A to 125D may be electrically coupled to the metal film E1 by, for example, side-surface electrodes disposed on the side surfaces of the front end portions 122A to 122D. The metal films 125A to 125D may be electrically coupled to the metal film E2.

Extended wiring lines C1 and C2 are formed on the protective film F5 of the holding portion 140. The extended wiring line C1 is electrically coupled to the metal film E1 through the through hole formed in the piezoelectric film F3 and the protective film F5. The extended wiring line C2 is electrically coupled to portions of the metal film E2 formed on the outer vibration arms 121A and 121D through the through hole formed in the protective film F5. Although not illustrated in the drawing, the extended wiring line electrically coupled to portions of the metal film E2 formed on the inner vibration arms 121B and 121C is also formed on the protective film F5. The extended wiring lines C1 and C2 are formed of a metal material, such as aluminum (Al), germanium (Ge), gold (Au), or tin (Sn).

The bottom plate 22 and the side wall 23 of the lower lid 20 are integrally formed from a silicon substrate P10. The silicon substrate P10 is formed of a nondegenerate silicon semiconductor, and the resistivity there of is, for example, 10 Ω·cm or more. The thickness of the lower lid 20 is larger than the thickness of the silicon substrate F2 and is, for example, about 150 μm. The silicon substrate P10 corresponds to an example of a "first silicon substrate" according to the present disclosure.

When the resonator 10 and the lower lid 20 are assumed to be the MEMS substrate 50, for example, the silicon substrate P10 of the lower lid 20 corresponds to a support substrate (handle layer) of a SOI substrate, the silicon oxide film F21 of the resonator 10 corresponds to a BOX layer of the SOI substrate, and the silicon substrate F2 of the resonator 10 corresponds to an active layer (device layer) of the SOI substrate.

The blocking member B11 is disposed in the MEMS substrate 50. The blocking member B11 is disposed in the resonator 10 so as to be opposite to the upper lid 30 with respect to the multilayer structure composed of the metal films E1 and E2 and the piezoelectric film F3. The blocking member B11 penetrates the silicon substrate F2 and the silicon oxide film F21, and the bottom surface thereof is disposed in the interior of the through hole located in the silicon substrate P10. The blocking member B11 covers the bottom surface and the inner side surface of the inner surface of the through hole. That is, the blocking member B11 is disposed extending over the silicon substrate F2, the silicon oxide film F21, and the silicon substrate P10. The thickness of the blocking member B11 is more than the thickness of the silicon oxide film F21. That is, a portion of a film of the blocking member B11 formed on the bottom surface of the through hole covers the end portion of the silicon oxide film F21 exposed due to the through hole. The internal space of the through hole may be filled with the blocking member B11, or a space surrounded by the film of the blocking member B11 formed along the inner surface of the through hole may be filled with another member. The lower end portion of the blocking member B11 is surrounded by the silicon substrate P10, and the upper end portion of the blocking member B11 is covered with the piezoelectric film F3. As described above, The blocking member B11 is formed in the holding portion 140 so as to have a frame-like shape surrounding the vibration portion 110. Therefore, the blocking member B11 divides the silicon oxide film F21. Specifically, the silicon oxide film F21 is divided into a part inside the blocking member B11, a portion of the part being exposed to the vibration space, and a part outside the blocking member B11, a portion of the part being exposed to the external space.

It is sufficient that the blocking member B11 covers at least the inner side surface of the inner surface of the through hole. That is, it is sufficient that the end portion of the silicon oxide film F21 exposed due to the through hole is covered. Consequently, a helium gas or the like can be hindered from entering through the silicon oxide film F21. In the example illustrated in FIG. 4, the through hole in which the blocking member B11 is disposed in the interior is covered with the piezoelectric film F3 but may be covered with the metal film E1 or other members.

In this regard, the blocking member B11 may divide a silicon oxide film, other than the silicon oxide film F21, disposed between layers. For example, when the MEMS substrate 50 includes a silicon oxide film between the silicon substrate F2 and metal film E1 or between the silicon substrate F2 and the piezoelectric film F3, the blocking member B11 may divide the silicon oxide film. In addition, when the MEMS substrate 50 includes a silicon oxide film between the metal film E2 and the protective film F5 or between the piezoelectric film F3 and the protective film F5, the blocking member B11 may divide the silicon oxide film.

In this regard, the configuration is not limited to the above provided that the blocking member B11 divides the silicon oxide film F21. For example, the blocking member B11 may be disposed in the interior of the through hole formed in only the silicon oxide film F21 or may be disposed in the interior of the through hole formed from the upper surface of the MEMS substrate 50 (surface on the upper lid 30 side) to the silicon oxide film F21. Alternatively, the blocking member B11 may be disposed in the interior of the through hole formed from the lower surface of the MEMS substrate 50 (surface opposite to the upper lid 30), that is, the lower surface of the silicon substrate P10, to the silicon oxide film F21.

The blocking member B11 has lower helium gas permeability (hereafter referred to as "helium permeability") than the silicon oxide film F21. In this regard, the silicon oxide film F21 has higher helium permeability than the silicon substrates P10 and F2, the piezoelectric film F3, the metal films E1 and E2, or the like of the members constituting the MEMS substrate 50. Therefore, helium is hindered from entering the vibration space of the resonator 10 through the silicon oxide film F21 due to the silicon oxide film F21 being divided by the blocking member B11, and the degree of vacuum of the vibration space of the resonator 10 is suppressed from decreasing. Likewise, gas having a small atomic radius other than helium is hindered by the blocking member B11 from entering the vibration space of the resonator 10.

There is no particular limitation regarding the material for forming the blocking member B11 provided that the material has lower helium permeability than the silicon oxide. The blocking member B11 is formed of a metal material containing, for example, aluminum (Al), germanium (Ge), gold (Au), silver (Ag), copper (Cu), or tin (Sn) as a primary component. However, the blocking member B11 is not limited to the above, may be formed of a semiconductor material such as silicon or a ceramic material such as silicon nitride, or may be formed of a combination thereof. The blocking member B11 being formed of a metal material enables helium to be effectively hindered from entering the vibration space. The blocking member B11 being formed of silicon or silicon nitride enables helium to be hindered from entering the vibration space without occurrence of metal diffusion from the blocking member B11 to the silicon substrates P10 and F2.

The bottom plate 32 and the side wall 33 of the upper lid 30 is integrally formed from the silicon substrate Q10. A silicon oxide film Q11 is disposed on the surface of the silicon substrate Q10. Specifically, the silicon oxide film Q11 is disposed in a region between the silicon substrate Q10 and penetration electrodes V1 and V2 described later, in a region between the silicon substrate Q10 and internal terminals Y1 and Y2 described later, and a region between the silicon substrate Q10 and external terminals T1 and T2 described later. The silicon oxide film Q11 hinders short-circuit of the electrode and the like through the silicon substrate Q10. In this regard, since an electrode and the like causing short-circuit is not disposed on the inner surface of the cavity 31 that is a portion of the surface of the silicon substrate Q10, the silicon substrate Q10 may be exposed at the inner wall of the cavity 31. The silicon oxide film Q11 is formed by, for example, thermal oxidation or chemical vapor deposition (CVD) of the silicon substrate Q10. The thickness of the upper lid 30 is, for example, about 150 μm. The silicon substrate Q10 corresponds to an example of a "second silicon substrate" according to the present disclosure.

A metal film 70 is disposed on the lower surface of the bottom plate 32 of the upper lid 30. The metal film 70 is a getter for occluding gas in the vibration space composed of the cavities 21 and 31 so as to improve the degree of vacuum and occludes, for example, a hydrogen gas. The metal film 70 contains, for example, titanium (Ti), zirconium (Zr), vanadium (V), niobium (Nb), or tantalum (Ta) or an alloy containing at least one of these. The metal film 70 may contain an oxide of an alkali metal or an oxide of alkaline-earth metal. A layer not illustrated in the drawing, for example, a layer for preventing hydrogen from diffusing from the silicon substrate Q10 to the metal film 70 or a layer for improving the close contact between the silicon substrate Q10 and the metal film 70 may be disposed between the silicon substrate Q10 and the metal film 70.

The penetration electrodes V1 and V2 are disposed in the upper lid 30. The penetration electrodes V1 and V2 are disposed in the interior of the through hole formed through the side wall 33 in the Z-axis direction. The penetration electrodes V1 and V2 are surrounded by the silicon oxide film Q11 and are insulated from each other. The penetration electrodes V1 and V2 are formed by the through hole being filled with, for example, polycrystalline silicon (Poly-Si), copper (Cu), or gold (Au).

The internal terminals Y1 and Y2 are disposed on the lower surface of the upper lid 30, and the external terminals T1 and T2 are disposed on the upper surface of the upper lid 30. The internal terminal Y1 is connected to the lower end portion of the penetration electrode V1, and the external terminal T1 is connected to the upper end portion of the penetration electrode V1. The internal terminal Y2 is connected to the lower end portion of the penetration electrode V2, and the external terminal T2 is connected to the upper end portion of the penetration electrode V2. The internal terminal Y1 is a connection terminal electrically coupling the penetration electrode V1 to the extended wiring line C1, and the external terminal T1 is a mounting terminal for grounding the metal film E1. The internal terminal Y2 is a connection terminal electrically coupling the penetration electrode V2 to the extended wiring line C2, and the external terminal T2 is a mounting terminal for electrically coupling the metal film E2 of the outer vibration arms 121A and 121D to the external power supply. In this regard, although not illustrated in the drawing, the upper lid 30 is further provided with a through hole, an internal terminal and an external terminal electrically coupled to the metal film E2 of the inner vibration arms 121B and 121C.

The plurality of internal terminals including the internal terminals Y1 and Y2 are electrically insulated from each other by the silicon oxide film Q11. The plurality of external terminals including the external terminals T1 and T2 are also electrically insulated from each other by the silicon oxide film Q11. The plurality of internal terminals and the plurality of external terminals are formed by, for example, applying plating of nickel (Ni), gold (Au), silver (Ag), copper (Cu), or the like to a metallized layer (underlying layer) of chromium (Cr), tungsten (W), nickel (Ni), or the like. In this regard, to adjust the balance between the parasitic capacity or the mechanical strength, the plurality of external terminals may include a dummy terminal electrically insulated from the resonator 10.

The bonding portion H is formed between the side wall 33 of the upper lid 30 and the holding portion 140 of the resonator 10. The bonding portion H is disposed having a continuous frame-like shape surrounding the vibration portion 110 in the circumferential direction in plan view and hermetically seals, in a vacuum state, the vibration space composed of the cavities 21 and 31. The bonding portion H is formed from, for example, a metal film in which an aluminum (Al) film, a germanium (Ge) film, and an aluminum (Al) film are stacked in this order from the resonator 10 side and bonded by eutectic bonding. The bonding portion H may contain gold (Au), tin (Sn), copper (Cu), titanium (Ti), aluminum (Al), germanium (Ge), or silicon (Si) or an alloy containing at least one of these. In addition, to improve the close contact between the resonator 10 and the upper lid 30, the bonding portion H may contain an insulator composed of a metal compound, such as titanium nitride (TiN) or tantalum nitride (TaN). In this regard, each of the metal films of the bonding portion H is illustrated as an independent layer in the drawing. However, since a eutectic alloy is formed actually, a clear boundary is not limited to being present.

Figure 5:
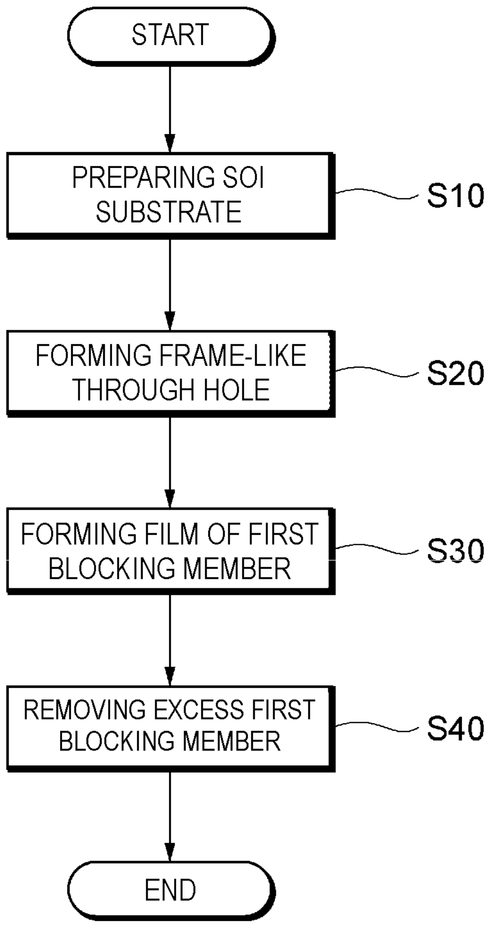
FIG. 5 is a schematic flow chart illustrating a method for manufacturing a MEMS substrate according to the first embodiment.
Figure 6:
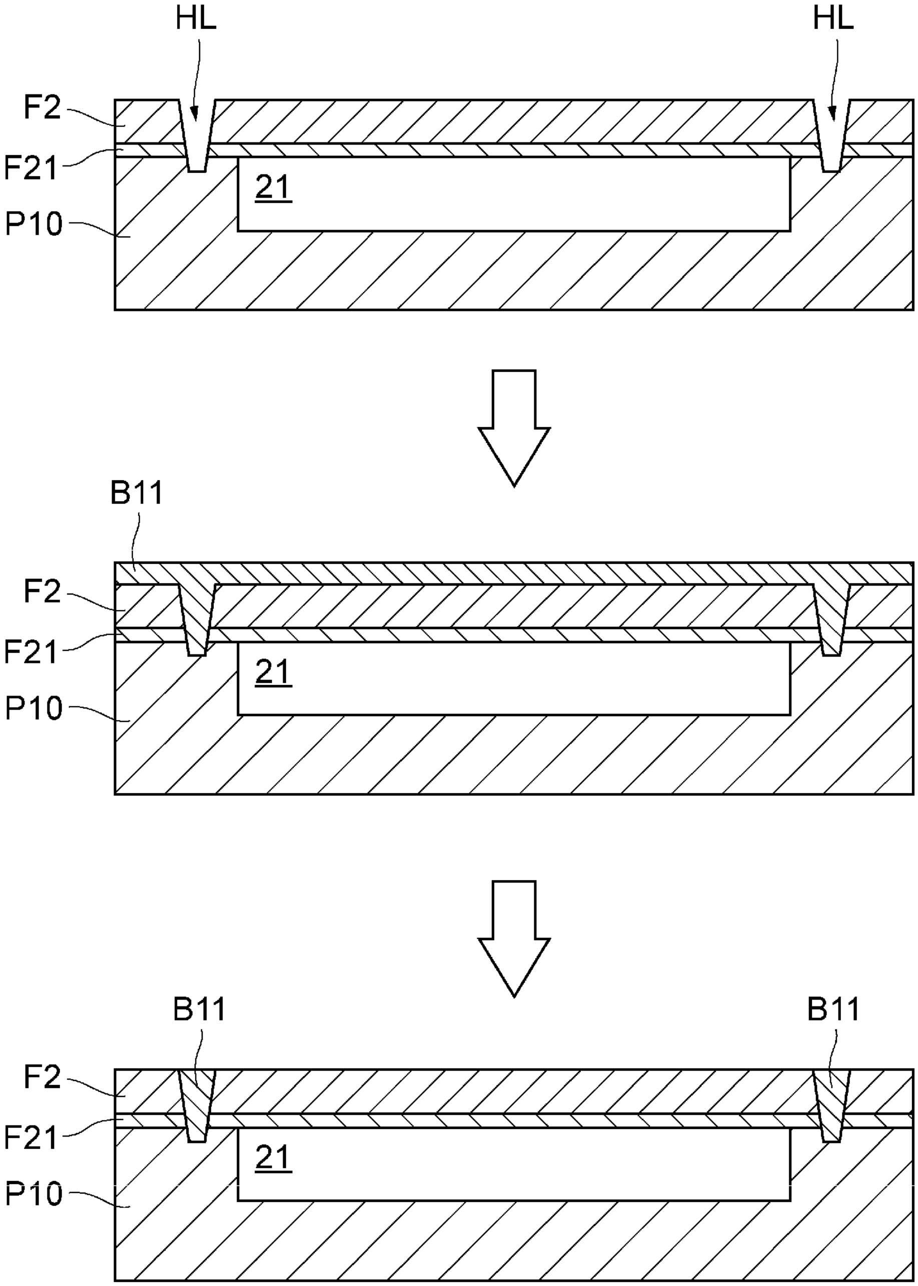
FIG. 6 is a schematic diagram illustrating steps of disposing a first blocking member.

Next, a method for manufacturing the resonance device 1 according to the first embodiment will be described with reference to FIG. 5 and FIG. 6. FIG. 5 is a schematic flow chart illustrating the method for manufacturing the MEMS substrate according to the first embodiment. FIG. 6 is a schematic diagram illustrating steps of disposing the blocking member. In this regard, of the steps of manufacturing the resonance device, the step of manufacturing the upper lid 30, the step of bonding the MEMS substrate 50 to the upper lid 30, and the like can use the manufacturing method in the related art and, herein, explanations thereof are omitted.

A SOI substrate is prepared (S10). Initially, each of the silicon substrates P10 and F2 subjected to single-side mirror polishing is prepared. The cavity 21 is formed on the mirror surface side of the silicon substrate P10, and the silicon oxide film F21 is formed on the mirror surface side of the silicon substrate F2. Subsequently, the mirror surface side of the silicon substrate P10 and the mirror surface side of the silicon substrate F2 are bonded and heat-treated so as to directly bond the silicon substrate P10 to the silicon oxide film F21.

A frame-like through hole HL is formed (S20). The through hole HL is formed by etching, as a removal process, from the upper surface of the silicon substrate F2. The through hole HL passes through the silicon substrate F2 and the silicon oxide film F21, and a recessed portion is formed in the silicon substrate P10. The through hole HL is formed having a continuous frame-like shape surrounding the cavity 21 in the circumferential direction in plan view of the SOI substrate. In this regard, the removal process for forming the through hole HL is not limited to etching, and the through hole HL may be formed by, for example, a cutting process, a grinding process, electric discharge machining, or laser machining.

The film of the blocking member B11 is formed (S30). The film of the blocking member B11 is formed by, for example, a vapor deposition method, such as PVD (Physical Vapor Deposition) or CVD (Chemical Vapor Deposition). The blocking member B11 is formed in the interior of the through hole HL and covers the upper surface of the silicon substrate F2. To fill the interior of the through hole HL with the blocking member B11, it is desirable that the film of the blocking member B11 be formed by plasma CVD capable of forming a thick film.

An excess blocking member B11 is removed (S40). Specifically, the blocking member B11 disposed on the upper surface of the silicon substrate F2 is removed so as to expose the upper surface of the silicon substrate F2 while the blocking member B11 disposed in the interior of the through hole HL is left. The excess blocking member B11 is removed by, for example, a polishing process.

Thereafter, films of the metal film E1, the piezoelectric film F3, the metal film E2, the protective film F5, and the like are successively formed on the silicon substrate F2, and the vibration portion 110, the holding portion 140, and the holding arm 150 of the resonator 10 are patterned by etching. Subsequently, the mass addition film is trimmed while the frequency of the resonator 10 is monitored to adjust the frequency of the resonator 10. The thus produced MEMS substrate 50 is bonded to the prepared upper lid 30 by the bonding portion H in a vacuum atmosphere. Consequently, the resonance device 1 in which the vibration space of the resonator 10 is vacuum sealed is produced.

As described above, the resonance device 1 includes the silicon substrate P10, the silicon substrate F2, and the blocking member B11 interposed between the silicon substrate P10 and the silicon substrate F2, and the blocking member B11 divides the silicon oxide film F21. Accordingly, a helium gas or the like are hindered from entering through the silicon oxide film F21, and the degree of vacuum in the vibration space can be suppressed from decreasing.

In this regard, the silicon oxide film F21 divided by the blocking member B11 is interposed between the silicon substrate P10 and the silicon substrate F2, the silicon oxide film F21 corresponds to a BOX layer of the SOI substrate, and the silicon substrate F2 corresponds to an active layer of the SOI substrate. Since the silicon substrate F2 constituting the resonator 10 is composed of single-crystal Si, favorable frequency temperature characteristics are obtained compared with the instance in which the silicon substrate F2 is formed of polycrystalline Si or amorphous Si. In this regard, when a blocking member is disposed in the interior of the through hole that passes through only a silicon oxide film and, thereafter, silicon substrates are bonded to each other with the silicon oxide film and the blocking member interposed therebetween, it is necessary that the surfaces of the silicon oxide film and the blocking member are polished before the silicon substrates are bonded to each other. However, the surface of the blocking member becomes concave or convex relative to the surface of the silicon oxide film in accordance with the difference in the hardness. Consequently, a gap serving as a path of entry of a helium gas or the like may be generated between the silicon substrate and the silicon oxide film or between the silicon substrate and the blocking member. On the other hand, in the resonance device 1 according to the present embodiment, since the through hole is formed after the silicon substrate P10 is bonded to the silicon substrate F2 with the silicon oxide film F21 interposed therebetween, and the blocking member B11 is disposed in the interior of the through hole, a gap serving as a path of entry of a helium gas or the like is not readily generated, and the degree of vacuum in the vibration space can be suppressed from decreasing.

Since the through hole in which the blocking member B11 is disposed in the interior is formed after the silicon substrate P10 is bonded to the silicon substrate F2 with the silicon oxide film F21 interposed therebetween and before the multilayer structure composed of the lower electrode, the piezoelectric film F3, and the upper electrode is disposed, the through hole can be made shallow compared with the form in which through hole is formed after the multilayer structure is disposed. Consequently, even when the inclination of the inner side surface relative to the bottom surface of the through hole is increased to facilitate the inner side wall being covered with the blocking member B11, the resonance device 1 can be suppressed from being upsized. In addition, making the through hole shallow enables the mechanical strength of the MEMS substrate 50 to be suppressed from deteriorating.

Since the thickness of the blocking member B11 is more than the thickness of the silicon oxide film F21, the blocking member B11 covering the bottom surface of the through hole sufficiently covers the end portion of the silicon oxide film F21 exposed at the inner side surface of the through hole, and a helium gas can be hindered from entering through the silicon oxide film F21. In particular, even when the film of the blocking member B11 is not readily formed on the inner side surface of the through hole, such as when the through hole is deep or when the inner side surface of the through hole is substantially perpendicular to the bottom surface, the end portion of the silicon oxide film F21 exposed at the inner side surface of the through hole can be sufficiently covered with the film of the blocking member B11 formed on the bottom surface of the through hole.

Since the blocking member B11 covers at least the inner side surface of the inner surface of the through hole, the end portion of the silicon oxide film F21 exposed at the inner side surface of the through hole can be covered with the blocking member B11, and a helium gas or the like can be hindered from entering through the silicon oxide film F21.

When the blocking member B11 is composed of silicon or silicon nitride, a helium gas or the like can be hindered from entering without occurrence of metal diffusion into the silicon substrate P10 and the silicon substrate F2.

When the blocking member B11 is composed of metal, a helium gas or the like can be effectively hindered from entering.

Other embodiments will be described below. In this regard, configurations that are the same as or similar to the configurations illustrated in FIG. 1 to FIG. 6 are indicated by the same or similar references and explanations thereof are appropriately omitted. In addition, the same operations and advantages due to the same configurations will not be described one by one.

Second Embodiment

Figure 7:
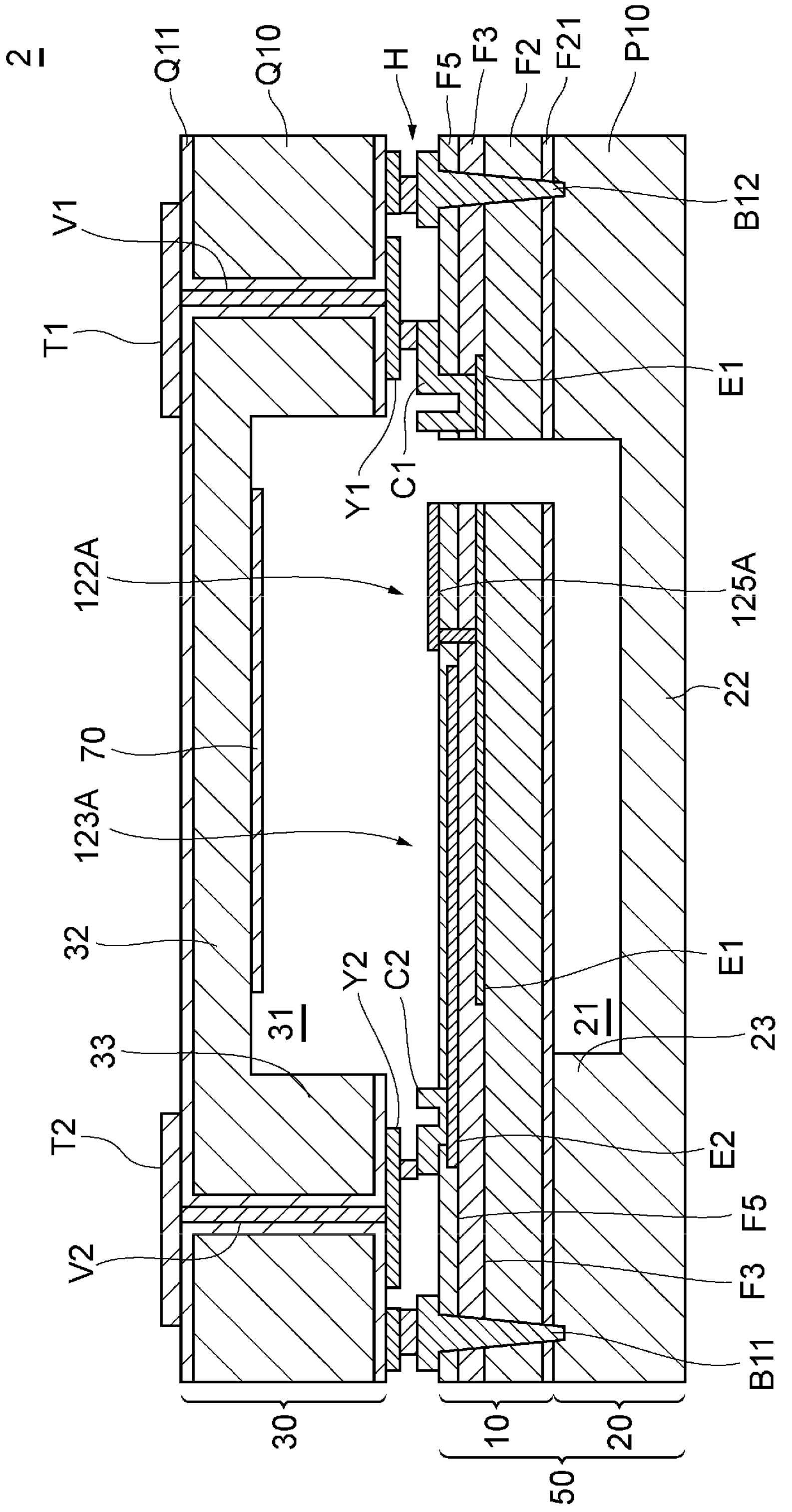
FIG. 7 is a conceptual sectional view illustrating the multilayer structure of a resonance device according to a second embodiment.

Next, the structure of a resonance device 2 according to a second embodiment will be described with reference to FIG. 7. FIG. 7 is a conceptual sectional view illustrating the multilayer structure of the resonance device according to the second embodiment.

In the second embodiment, a blocking member B12 overlaps the bonding portion H in plan view. The blocking member B12 is disposed in the interior of a through hole that passes from the uppermost layer of the MEMS substrate 50 to the silicon oxide film F21. Accordingly, when the uppermost layer of the MEMS substrate 50 is disposed of a silicon oxide, a helium gas or the like can be hindered from entering the vibration space through the uppermost layer. In this regard, the blocking member B12 is composed of the material constituting the bonding portion H. Accordingly, since the blocking member B12 can be disposed in the step of disposing the bonding portion H, the production process can be simplified. In addition, even when the MEMS substrate 50 includes a silicon oxide film other than the silicon oxide film F21 interposed between the silicon substrate P10 and the silicon substrate F2, according to the present embodiment, the silicon oxide film can be blocked by the blocking member B12 in the manner akin to that of the silicon oxide film F21.

Third Embodiment

Figure 8:
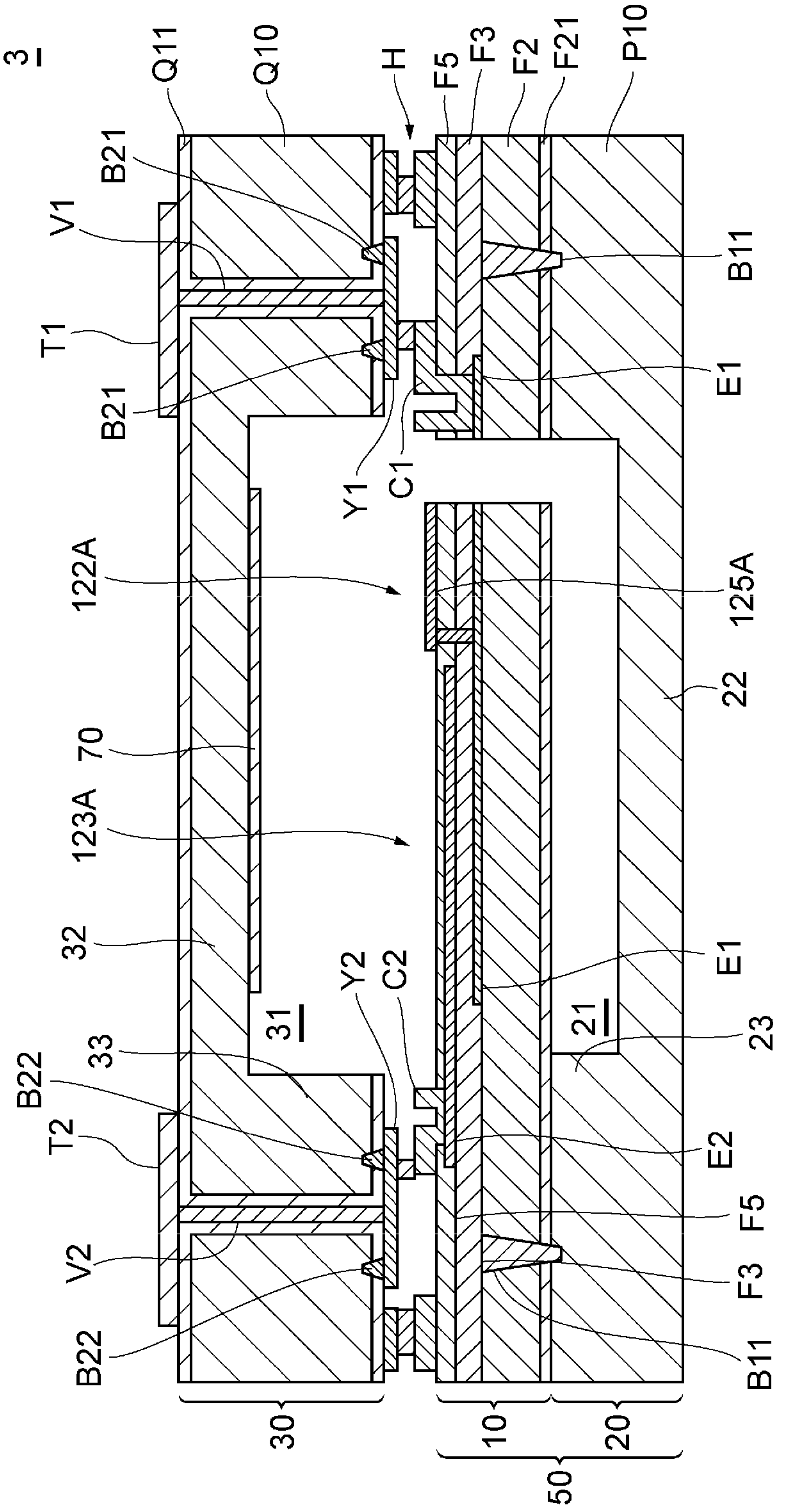
FIG. 8 is a conceptual sectional view illustrating the multilayer structure of a resonance device according to a third embodiment.

Next, the structure of a resonance device 3 according to a third embodiment will be described with reference to FIG. 8. FIG. 8 is a conceptual sectional view illustrating the multilayer structure of the resonance device according to the third embodiment.

In the third embodiment, the resonance device 3 further includes blocking members B21 and B22. The blocking member B21 is disposed in a region between the silicon substrate Q10 and the internal terminal Y1 of the upper lid 30, and the blocking member B22 is disposed in a region between the silicon substrate Q10 and the internal terminal Y2 of the upper lid 30. The blocking members B21 and B22 are disposed in the interiors of the through holes that pass through the silicon oxide film Q11 and form recessed portions in the silicon substrate Q10. In plan view, the blocking member B21 is disposed having a frame-like shape surrounding the penetration electrode V1 and is continuous in the circumferential direction. In addition, the blocking member B22 is disposed having a frame-like shape surrounding the penetration electrode V2 and is continuous in the circumferential direction. The blocking members B21 and B22 divide the silicon oxide film Q11 into a region surrounded by the blocking member B21 or blocking member B22 and the other region. The blocking members B21 and B22 have lower helium permeability than the silicon oxide film Q11. Disposing the blocking members B21 and B22 enables a helium gas or the like to be hindered from entering the vibration space through the silicon oxide film Q11 surrounding the penetration electrodes V1 and V2. The blocking members B21 and B22 are formed of a nonmetal material such as silicon nitride. The reason for this is to prevent short-circuit between the internal terminal Y1 and the internal terminal Y2 through the silicon substrate Q10 from occurring.

Fourth Embodiment

Figure 9:
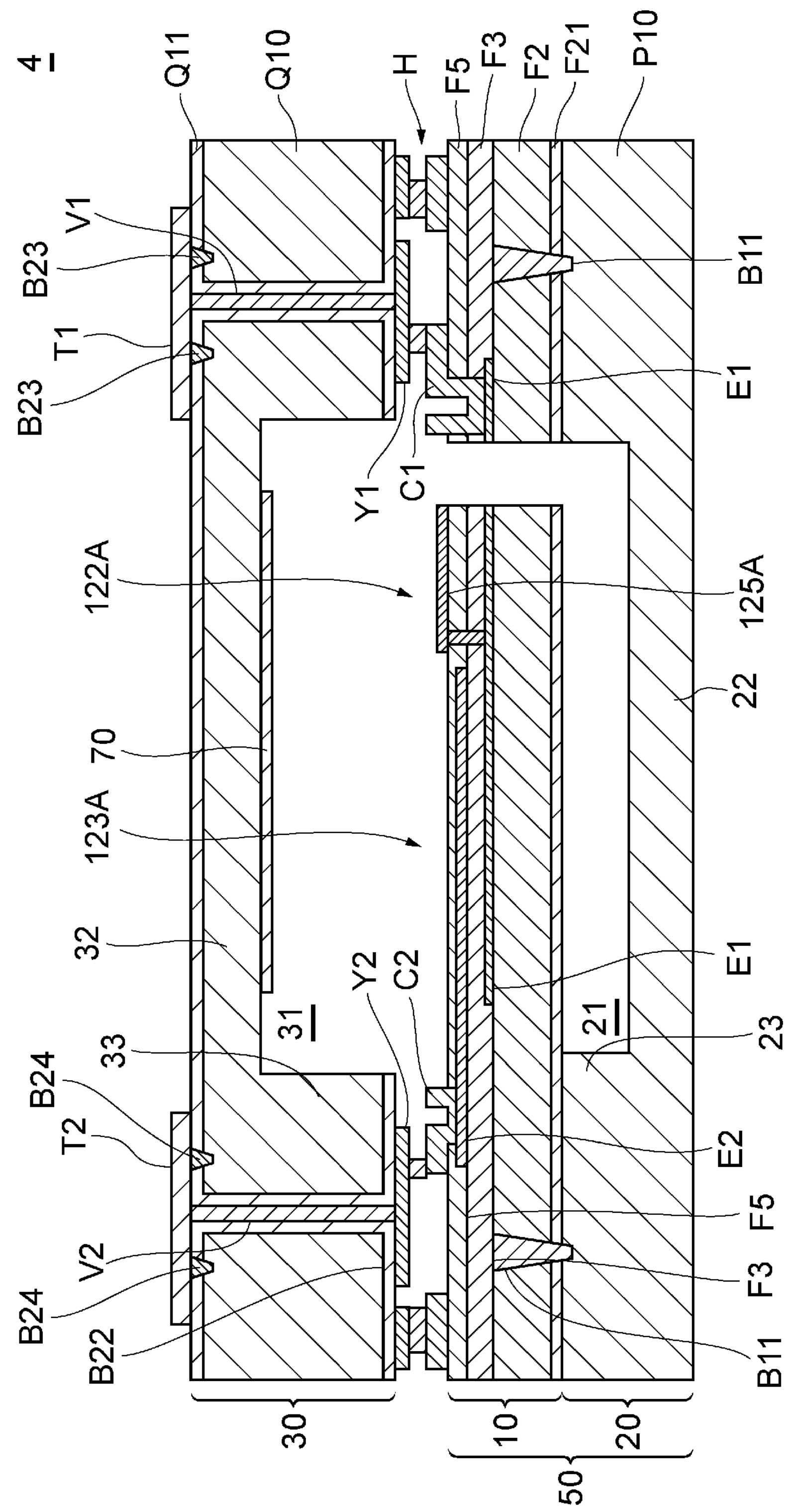
FIG. 9 is a conceptual sectional view illustrating the multilayer structure of a resonance device according to a fourth embodiment.

Next, the structure of a resonance device 4 according to a fourth embodiment will be described with reference to FIG. 9. FIG. 9 is a conceptual sectional view illustrating the multilayer structure of the resonance device according to the fourth embodiment.

In the fourth embodiment, the resonance device 4 further includes blocking members B23 and B24. The blocking member B23 is disposed in a region between the silicon substrate Q10 and the external terminal T1 of the upper lid 30, and the blocking member B24 is disposed in a region between the silicon substrate Q10 and the external terminal T2 of the upper lid 30. The blocking members B23 and B24 are disposed in the interiors of the through holes that pass through the silicon oxide film Q11 and form recessed portions in the silicon substrate Q10. In plan view, the blocking member B23 is disposed having a frame-like shape surrounding the penetration electrode V1 and is continuous in the circumferential direction. In addition, the blocking member B24 is disposed having a frame-like shape surrounding the penetration electrode V2 and is continuous in the circumferential direction. The blocking members B23 and B24 divide the silicon oxide film Q11 into a region surrounded by the blocking member B23 or blocking member B24 and the other region. The blocking members B23 and B24 according to the fourth embodiment are formed of the nonmetal material akin to that of the blocking members B21 and B22 of the third embodiment. The blocking member may be disposed in both the region between the silicon substrate Q10 and the internal terminals Y1 and Y2 of the upper lid 30 and the region between the silicon substrate Q10 and the external terminals T1 and T2 of the upper lid 30.

Fifth Embodiment

Figure 10:
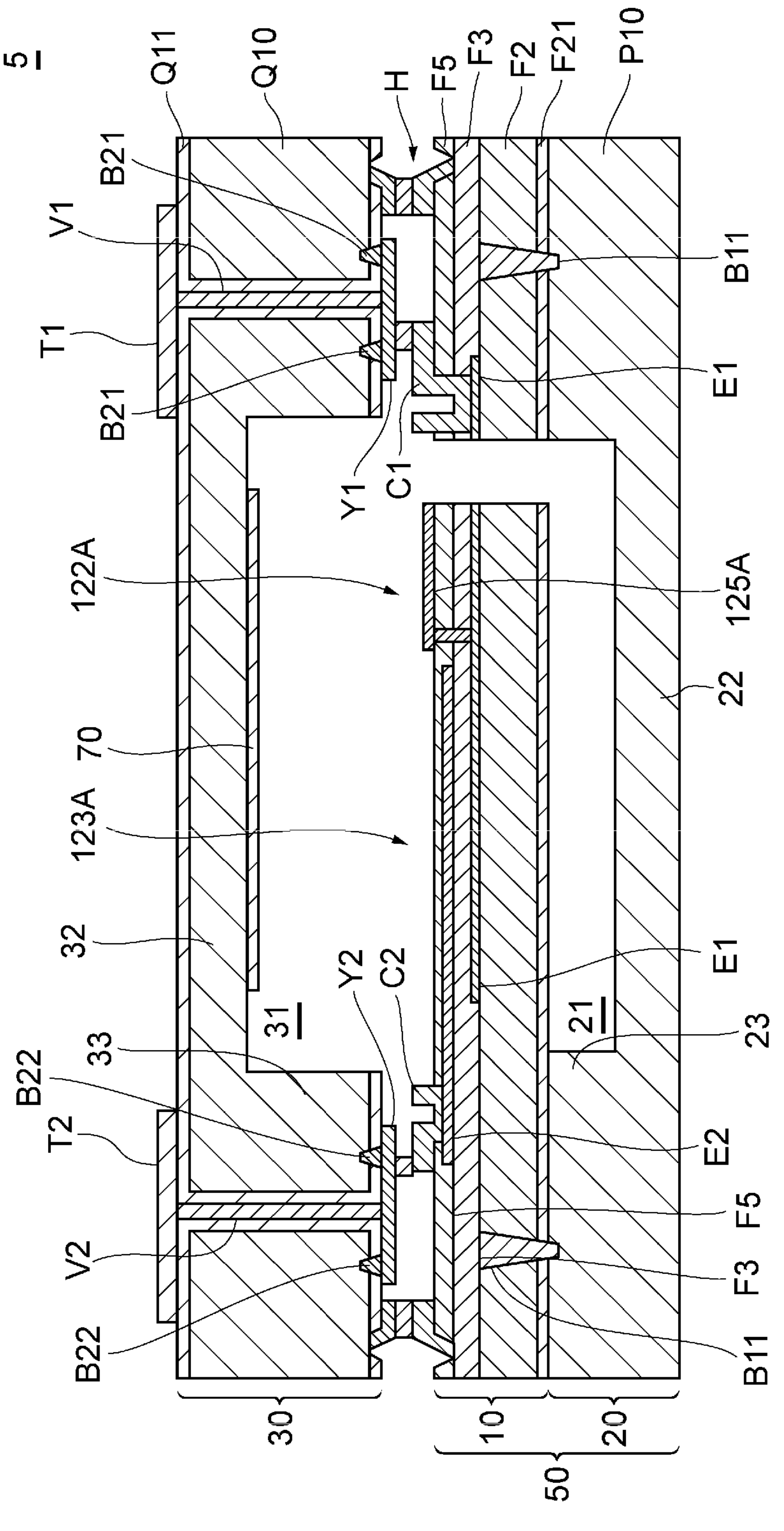
FIG. 10 is a conceptual sectional view illustrating the multilayer structure of a resonance device according to a fifth embodiment.

Next, the structure of a resonance device 5 according to a fifth embodiment will be described with reference to FIG. 10. FIG. 10 is a conceptual sectional view illustrating the multilayer structure of the resonance device according to the fifth embodiment.

In the fifth embodiment, the MEMS substrate 50 includes a silicon oxide film on the surface opposite the upper lid 30, and the end portion of the silicon oxide film is covered with a material constituting the bonding portion H. In addition, the upper lid 30 includes a silicon oxide film on the surface opposite the MEMS substrate 50, and the end portion of the silicon oxide film is covered with a material constituting the bonding portion H. Accordingly, a helium gas or the like can be hindered from entering the vibration space through the silicon oxide films disposed on the surfaces of the MEMS substrate 50 and the upper lid 30 opposite each other.

A portion or all of the embodiments according to the present invention will be additionally described below. In this regard, the present invention is not limited to the additional description below.

According to an aspect of the present invention, a resonance device is provided that includes: a first substrate having a first silicon substrate and a resonator, wherein the resonator includes a single-crystal silicon film and a first silicon oxide film interposed between the single-crystal silicon film and the first silicon substrate, and a through hole that passes through the single-crystal silicon film and the first silicon oxide film; a second substrate opposite the first substrate; a frame shaped bonding portion that bonds the first substrate to the second substrate to seal a vibration space of the resonator; and a first blocking member disposed in an interior of the through hole and surrounding a vibration portion of the resonator in a plan view of the first substrate so as to divide the first silicon oxide film, wherein the first blocking member has a lower helium permeability than the first silicon oxide film.

According to an aspect, a thickness of the first blocking member may be more than a thickness of the first silicon oxide film.

According to an aspect, the first blocking member may cover at least an inner side surface of the inner surface of the through hole.

According to an aspect, the resonator may include a lower electrode on a second substrate side of the first silicon oxide film, a piezoelectric film on a second substrate side of the lower electrode, and an upper electrode on a second substrate side of the piezoelectric film.

According to an aspect, the first blocking member may be composed of silicon or silicon nitride.

According to an aspect, the first blocking member may be composed of metal.

According to an aspect, the first blocking member may be in a region surrounded by the bonding portion in a plan view of the first substrate.

According to an aspect, the first blocking member may overlap the bonding portion in the plan view of the first substrate, and the first blocking member may be composed of a material of the bonding portion.

According to an aspect, the second substrate may include a second silicon substrate; a penetration electrode that penetrates the second silicon substrate; an internal terminal on a first substrate side of the penetration electrode; an external terminal opposite to the first substrate side of the penetration electrode; a second silicon oxide film extending continuously over a region between the second silicon substrate and the penetration electrode, an inner region between the second silicon substrate and the internal terminal, and an outer region between the second silicon substrate and the external terminal, and the resonance device further includes: a second blocking member surrounding the penetration electrode in a plan view of the second substrate in at least one of the inner region and the outer region so as to divide the second silicon oxide film, and the second blocking member has a lower helium permeability than the second silicon oxide film.

According to an aspect, the second blocking member may be composed of silicon nitride.

According to an aspect, the first substrate may include a third silicon oxide film on a surface opposite the second substrate, and an end portion of the third silicon oxide film may be covered with a material constituting the bonding portion.

According to an aspect, the second substrate may include a fourth silicon oxide film on a surface opposite the first substrate, and an end portion of the fourth silicon oxide film may be covered with a material of the bonding portion.

According to another aspect of the present invention, a resonance device is provided that includes: including a first substrate having a resonator; a second substrate opposite the first substrate, the second substrate including a silicon substrate, a penetration electrode that penetrates the silicon substrate, an internal terminal on a first substrate side of the penetration electrode, an external terminal opposite to the first substrate side of the penetration electrode, and a silicon oxide film extending continuously over a region between the silicon substrate and the penetration electrode, an inner region between the silicon substrate and the internal terminal, and an outer region between the silicon substrate and the external terminal; a bonding portion that bonds the first substrate to the second substrate to seal a vibration space of the resonator; and a blocking member surrounding the penetration electrode in a plan view of the second substrate in the inner region and dividing the silicon oxide film, and the blocking member has a lower helium permeability than the silicon oxide film.

According to another aspect of the present invention, a method for manufacturing a resonance device is provided that includes: preparing a first substrate having a silicon substrate and a resonator, wherein the resonator includes a single-crystal silicon film and a silicon oxide film interposed between the single-crystal silicon film and the silicon substrate; preparing a second substrate; forming a through hole that passes through the single-crystal silicon film and the silicon oxide film in the resonator of the first substrate; disposing a blocking member in an interior of the through hole so as to surround the vibration portion of the resonator in a plan view of the first substrate and divide the silicon oxide film, the blocking member having a lower helium permeability than the silicon oxide film; and bonding the first substrate to the second substrate to seal a vibration space of the resonator.

According to an aspect, the preparing of the first substrate may include: bonding the silicon substrate to the single-crystal silicon film with the silicon oxide film interposed therebetween; forming the through hole that passes through the silicon oxide film from a single-crystal silicon film side; covering the inner surface of the through hole with the blocking member; and disposing a multilayer structure including a lower electrode, a piezoelectric film, and an upper electrode on the single-crystal silicon film and the blocking member.

According to an aspect, the preparing of the first substrate may include: bonding the silicon substrate to the single-crystal silicon film with the silicon oxide film interposed therebetween; disposing a multilayer structure including a lower electrode, a piezoelectric film, and an upper electrode on the single-crystal silicon film; forming the through hole that passes through the silicon oxide film from a multilayer structure side; and covering the inner surface of the through hole with the blocking member.

The embodiment according to the present invention can be appropriately applied to devices, such as timing devices, sound-generating devices, oscillators, and load sensors, which utilize frequency characteristics of the vibrator, without particular limitation.

As described above, according to an aspect of the present invention, a resonance device capable of suppressing the degree of vacuum from decreasing and capable of having favorable frequency temperature characteristics and a method for manufacturing the same can be provided.

In this regard, the embodiments described above are for the sake of facilitating understanding of the present invention and are not for restricting the interpretation of the present invention. The present invention is modified/improved without departing from the scope and spirit of the invention, and the present invention includes the equivalents thereof. That is, the embodiments to which those skilled in the art appropriately applied design changes are also included in the scope of the present invention provided that the features of the present invention are provided. For example, the elements and arrangements, materials, conditions, shapes, sizes, and the like thereof included in the embodiments are not limited to those described as examples and can be appropriately changed. In addition, the elements included in the embodiments can be combined when it is technically possible, and combinations thereof are also included in the scope of the present invention provided that the features of the present invention are provided.

REFERENCE SIGNS LIST

1 resonance device
10 resonator
20 lower lid
30 upper lid
50 MEMS substrate
110 vibration portion
140 holding portion
150 holding arm
H bonding portion
B11, B12, B21, B22, B23, B24 blocking member
P10, Q10, F2 silicon substrate
F21, Q11 silicon oxide film
F3 piezoelectric film
F5 protective film
V1, V2 penetration electrode
Y1, Y2 internal terminal
T1, T2 external terminal

The invention claimed is:

1. A resonance device comprising:
a first substrate having a first silicon substrate and a resonator, wherein the resonator includes a single-crystal silicon film and a first silicon oxide film interposed between the single-crystal silicon film and the first silicon substrate, and a through hole that passes through the single-crystal silicon film and the first silicon oxide film;
a second substrate opposite the first substrate;
a frame shaped bonding portion that bonds the first substrate to the second substrate to seal a vibration space of the resonator; and
a first blocking member disposed in an interior of the through hole and surrounding a vibration portion of the resonator in a plan view of the first substrate so as to divide the first silicon oxide film, wherein the first blocking member has a lower helium permeability than the first silicon oxide film,
wherein the first silicon oxide film divided by the first blocking member includes a first part on a vibration portion side of the first blocking member, a portion of the first part being exposed to the vibration space, and a second part on an outer side of the first blocking member, a portion of the second part being exposed to an external space.

2. The resonance device according to claim 1, wherein a thickness of the first blocking member is more than a thickness of the first silicon oxide film.

3. The resonance device according to claim 1, wherein the first blocking member covers at least an inner side surface of the inner surface of the through hole.

4. The resonance device according to claim 1, wherein the resonator includes:
a lower electrode on a second substrate side of the first silicon oxide film;
a piezoelectric film on a second substrate side of the lower electrode; and
an upper electrode on a second substrate side of the piezoelectric film.

5. The resonance device according to claim 1, wherein the first blocking member is composed of silicon or silicon nitride.

6. The resonance device according to claim 1, wherein the first blocking member is composed of metal.

7. The resonance device according to claim 1, wherein the first blocking member is in a region surrounded by the bonding portion in the plan view of the first substrate.

8. The resonance device according to claim 1,
wherein the first blocking member overlaps the bonding portion in the plan view of the first substrate, and
the first blocking member is composed of a material of the bonding portion.

9. The resonance device according to claim 1,
wherein the first substrate includes a second silicon oxide film on a surface opposite the second substrate, and
an end portion of the second silicon oxide film is covered with a material of the bonding portion.

10. The resonance device according to claim 9,
wherein the second substrate includes a third silicon oxide film on a surface opposite the first substrate, and an end portion of the third silicon oxide film is covered with a material of the bonding portion.

11. The resonance device according to claim 1,
wherein the second substrate includes a second silicon oxide film on a surface opposite the first substrate, and
an end portion of the second silicon oxide film is covered with a material of the bonding portion.

12. The resonance device according to claim 1,
wherein the second substrate includes:
a second silicon substrate;
a penetration electrode that penetrates the second silicon substrate;
an internal terminal on a first substrate side of the penetration electrode;
an external terminal opposite to the first substrate side of the penetration electrode;
a second silicon oxide film extending continuously over a region between the second silicon substrate and the penetration electrode, an inner region between the second silicon substrate and the internal terminal, and an outer region between the second silicon substrate and the external terminal, and
wherein the resonance device further comprises:
a second blocking member surrounding the penetration electrode in a plan view of the second substrate in at least one of the inner region and the outer region so as to divide the second silicon oxide film, and the second blocking member has a lower helium permeability than the second silicon oxide film, and
wherein the second silicon oxide film divided by the second blocking member includes a third part on a vibration portion side of the second blocking member, a portion of the third part being exposed to the vibration space, and a fourth part on an outer side of the second blocking member, a portion of the fourth part being exposed to the external space.

13. The resonance device according to claim 12, wherein the second blocking member is composed of silicon nitride.

14. The resonance device according to claim 12,
wherein the first substrate includes a third silicon oxide film on a surface opposite the second substrate, and
an end portion of the third silicon oxide film is covered with a material of the bonding portion.

15. The resonance device according to claim 14,
wherein the second substrate includes a fourth silicon oxide film on a surface opposite the first substrate, and
an end portion of the fourth silicon oxide film is covered with a material of the bonding portion.

16. A resonance device comprising:
a first substrate having a resonator;
a second substrate opposite the first substrate, the second substrate including a silicon substrate, a penetration electrode that penetrates the silicon substrate, an internal terminal on a first substrate side of the penetration electrode, an external terminal opposite to the first substrate side of the penetration electrode, and a silicon oxide film extending continuously over a region between the silicon substrate and the penetration electrode, an inner region between the silicon substrate and the internal terminal, and an outer region between the silicon substrate and the external terminal;
a bonding portion that bonds the first substrate to the second substrate to seal a vibration space of the resonator; and a blocking member surrounding the penetration electrode in a plan view of the second substrate in the inner region and dividing the silicon oxide film, and the blocking member has a lower helium permeability than the silicon oxide film,
wherein the silicon oxide film divided by the blocking member includes a first part on a vibration portion side of the blocking member, a portion of the first part being exposed to the vibration space, and a second part on an outer side of the blocking member, a portion of the second part being exposed to an external space.

17. The resonance device according to claim 16, wherein the blocking member is composed of silicon nitride.

18. A method for manufacturing a resonance device comprising:
preparing a first substrate having a silicon substrate and a resonator, wherein the resonator includes a single-crystal silicon film and a silicon oxide film interposed between the single-crystal silicon film and the silicon substrate;
preparing a second substrate;
forming a through hole that passes through the single-crystal silicon film and the silicon oxide film in the resonator of the first substrate;
disposing a blocking member in an interior of the through hole so as to surround the vibration portion of the resonator in a plan view of the first substrate and divide the silicon oxide film, the blocking member having a lower helium permeability than the silicon oxide film; and
bonding the first substrate to the second substrate to seal a vibration space of the resonator,
wherein the silicon oxide film divided by the blocking member includes a first part on a vibration portion side of the blocking member, a portion of the first part being exposed to the vibration space, and a second part on an outer side of the blocking member, a portion of the second part being exposed to an external space.

19. The method for manufacturing a resonance device according to claim 18,
wherein the preparing of the first substrate includes:
bonding the silicon substrate to the single-crystal silicon film with the silicon oxide film interposed therebetween;
forming the through hole that passes through the silicon oxide film from a single-crystal silicon film side;
covering the inner surface of the through hole with the blocking member; and
disposing a multilayer structure including a lower electrode, a piezoelectric film, and an upper electrode on the single-crystal silicon film and the blocking member.

20. The method for manufacturing a resonance device according to claim 18,
wherein the preparing of the first substrate includes:
bonding the silicon substrate to the single-crystal silicon film with the silicon oxide film interposed therebetween;
disposing a multilayer structure including a lower electrode, a piezoelectric film, and an upper electrode on the single-crystal silicon film;
forming the through hole that passes through the silicon oxide film from a multilayer structure side; and
covering the inner surface of the through hole with the blocking member.

* * * * *